(12) United States Patent
Jun et al.

(10) Patent No.: US 9,082,982 B2
(45) Date of Patent: Jul. 14, 2015

(54) SEMICONDUCTOR NANOCRYSTAL-POLYMER COMPOSITE, METHOD OF PREPARING THE SAME, AND COMPOSITE FILM AND OPTOELECTRONIC DEVICE INCLUDING THE SAME

(71) Applicant: Samsung Electronics Co., Ltd., Suwon-si, Gyeonggi-do (KR)

(72) Inventors: Shin Ae Jun, Seongnam-si (KR); Hyun A Kang, Suwon-si (KR); Eun Joo Jang, Suwon-si (KR); Soo Kyung Kwon, Seoul (KR); Hyo Sook Jang, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 153 days.

(21) Appl. No.: 13/656,327

(22) Filed: Oct. 19, 2012

(65) Prior Publication Data

US 2013/0099213 A1 Apr. 25, 2013

(30) Foreign Application Priority Data

Oct. 21, 2011 (KR) .................. 10-2011-0108334

(51) Int. Cl.
*H01L 29/08* (2006.01)
*H01L 51/00* (2006.01)
*C09K 11/02* (2006.01)
(Continued)

(52) U.S. Cl.
CPC ............. *H01L 51/0043* (2013.01); *B82Y 30/00* (2013.01); *C01B 17/20* (2013.01); *C01B 19/007* (2013.01); *C09K 11/02* (2013.01); *C09K 11/025* (2013.01); *C09K 11/565* (2013.01); *C09K 11/883* (2013.01); *H01L 33/501* (2013.01); *H01L 33/502* (2013.01); *H01L 51/004* (2013.01); *C01P 2002/88* (2013.01); *C01P 2004/64* (2013.01); *H01L 33/507* (2013.01); *H01L 51/50* (2013.01)

(58) Field of Classification Search
CPC .... H01L 33/501; H01L 33/502; H01L 33/507
USPC .......................................................... 257/40
See application file for complete search history.

(56) References Cited

U.S. PATENT DOCUMENTS

| 6,117,363 A | 9/2000 | Ihara et al. |
| 2010/0001634 A1 | 1/2010 | Fujita et al. |

(Continued)

FOREIGN PATENT DOCUMENTS

| JP | 6299099 A | 10/1994 |
| JP | 10310770 A | 11/1998 |

(Continued)

OTHER PUBLICATIONS

The Extended European Search Report for European Patent Application No. 12189290.5 dated Aug. 6, 2014.

(Continued)

*Primary Examiner* — Douglas Menz
(74) *Attorney, Agent, or Firm* — Cantor Colburn LLP

(57) ABSTRACT

A semiconductor nanocrystal-polymer composite including a semiconductor nanocrystal, a polymer comprising a plurality of carboxylate anion groups (—$COO^-$) bindable to a surface of the semiconductor nanocrystal, and a metal cation bindable to a carboxylate anion group of the plurality of carboxylate anion groups.

35 Claims, 14 Drawing Sheets

(51) Int. Cl.
*C09K 11/56* (2006.01)
*H01L 33/50* (2010.01)
*C09K 11/88* (2006.01)
*C01B 17/20* (2006.01)
*C01B 19/00* (2006.01)
*B82Y 30/00* (2011.01)
*H01L 51/50* (2006.01)

(56) References Cited

U.S. PATENT DOCUMENTS

2012/0001217 A1   1/2012   Kang et al.
2012/0293063 A1   11/2012  Kang et al.

FOREIGN PATENT DOCUMENTS

JP    2008055328 A     3/2008
KR    1020090055560 A  6/2009

OTHER PUBLICATIONS

Hwang et al., "Preparation and characterization of ZnS based nanocrystalline particles for polymer light-emitting diodes", Current Applied Physics, 5, 2005, pp. 31-34.

Konishi et al., "Enhancement of photoluminescence of ZnS: Mn nanocrystals by hybridizing with polymerized acrylic acid", Journal of Luminescence, 93, 2001, pp. 1-8.

SEMICONDUCTOR NANOCRYSTAL-POLYMER COMPOSITE, METHOD OF PREPARING THE SAME, AND COMPOSITE FILM AND OPTOELECTRONIC DEVICE INCLUDING THE SAME

This application claims priority to and the benefit of Korean Patent Application No. 10-2011-0108334, filed on Oct. 21, 2011, and all the benefits accruing therefrom under 35 U.S.C. §119, the content of which in its entirety is incorporated herein by reference.

BACKGROUND

1. Field

This disclosure relates to a semiconductor nanocrystal-polymer composite, a method of preparing the same, and a composite film and an optoelectronic device including the same.

2. Description of the Related Art

Semiconductor nanocrystals, which are also called quantum dots, are a semiconductor material with nano-sized particles having crystalline structure, which include hundreds to thousands of atoms.

Since the semiconductor nanocrystals are very small, they have a large surface area per unit volume, and also provide a quantum confinement effect. Accordingly, they have unique physicochemical properties that differ from the inherent characteristics of a corresponding bulk semiconductor material.

In particular, since optoelectronic properties of nanocrystals may be controlled by selecting their size, the semiconductor nanocrystals are being actively researched and applied to display devices and in biotechnology applications.

Generally, when the semiconductor nanocrystal is applied to an element of a display device, a silicone polymer may be used as a matrix resin for dispersing the semiconductor nanocrystal. However, since the silicone resin has insufficient compatibility with an organic ligand present on the surface of semiconductor nanocrystal, the semiconductor nanocrystal may undesirably aggregate. Thus when the silicone polymer is used, the organic ligand present on the surface of semiconductor nanocrystal may be lost, and the device efficiency may be decreased. Thus there remains a need for preventing aggregation of the semiconductor nanocrystals, and for a method for stabilizing the organic ligand on the surface of semiconductor nanocrystals.

SUMMARY

An embodiment provides a semiconductor nanocrystal-polymer composite that effectively protects a semiconductor nanocrystal and improves device efficiency and thermal stability, and a method of manufacturing the same.

Another embodiment provides a composition for manufacture of a semiconductor nanocrystal-polymer composite effectively protecting the semiconductor nanocrystal and improving the device efficiency and the thermal stability.

Yet another embodiment provides a composite film and an optoelectronic device including the semiconductor nanocrystal-polymer composite.

According to an embodiment, provided is a semiconductor nanocrystal-polymer composite that includes a semiconductor nanocrystal, a polymer including a plurality of carboxylate anion groups (—COO$^-$) bindable to a surface of the semiconductor nanocrystal, and a metal cation bindable to a carboxylate anion group of the plurality of carboxylate anion groups.

The semiconductor nanocrystal may be selected from a Group II-VI compound, a Group III-V compound, a Group IV-VI compound, a Group IV element, a Group IV compound, and a combination thereof.

The polymer having the carboxylate anion groups may include about 1 to about 100 mol % of a carboxylate anion group-containing structural unit in the polymer, based on a total moles of structural units of the polymer.

The polymer having the carboxylate anion groups may be included in an amount of about 50 to about 10,000 parts by weight, based on 100 parts by weight of the semiconductor nanocrystal.

The polymer having the carboxylate anion groups may have a melting point ("$T_m$") of about 50° C. to about 400° C.

The polymer having the carboxylate anion groups may be a polymer including an alkylene structural unit and a structural unit represented by the following Chemical Formula 1.

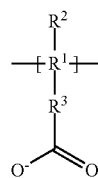

Chemical Formula 1

In Chemical Formula 1, $R^1$ is a substituted or unsubstituted C2 to C20 linear or branched alkylene group, $R^2$ is hydrogen or a methyl group, and $R^3$ is a single bond; a substituted or unsubstituted C1 to C50 alkylene group; a substituted or unsubstituted C2 to C50 alkenylene group; a C2 to C50 alkylene group wherein at least one methylene group (—CH$_2$—) is replaced with a sulfonyl group (—SO$_2$—), a carbonyl group (—C(O)—), an ether group (—O—), a sulfide group (—S—), a sulfoxide group (—S(O)—), an ester group (—C(=O)O—), an amide group (—C(=O)NR—, wherein R is hydrogen or a C1 to C10 alkyl group), an amino group (—NR—, wherein R is hydrogen or C1 to C10 alkyl group), or a combination thereof; or a C3 to C50 alkenylene group wherein at least one methylene group (—CH$_2$—) is replaced with a sulfonyl group (—SO$_2$—), a carbonyl group (—C(O)—), an ether group (—O—), a sulfide group (—S—), a sulfoxide group (—S(O)—), an ester group (—C(=O)O—), an amide group (—C(=O)NR—, wherein R is hydrogen or a C1 to C10 alkyl group), an amino group (—NR—, wherein R is hydrogen or C1 to C10 alkyl group), or a combination thereof.

The metal cation may be a cation of a metal selected from an alkaline-earth metal, a rare earth element, a transition element, a Group 12 element, a Group 13 element, and a combination thereof.

The metal cation may be a cation of a metal selected from Mg, Ca, Sc, Ti, V, Cr, Mn, Fe, Co, Ni, Cu, Zn, Ga, Sr, Y, Zr, Nb, Mo, Cd, In, Ba, Au, Hg, Tl, and a combination thereof.

The metal cation may be present in an amount of about 0.1 to about 1.5 moles, per mole of the carboxylate anion groups of the polymer.

According to another embodiment, provided is a composition for manufacture of a semiconductor nanocrystal-polymer composite, the composition including a semiconductor nanocrystal, a polymer including a plurality of carboxyl groups (—COOH), and a metal compound including a metal cation bindable to a carboxyl group of the plurality of carboxyl groups.

The polymer including the carboxyl groups may include a carboxyl group-containing structural unit in the polymer in an amount of about 1 to about 100 mole percent (mol %), based on a total moles of structural units of the polymer.

The polymer including the carboxyl groups may be included in an amount of about 50 to about 10,000 parts by weight, based on 100 parts by weight of the semiconductor nanocrystal.

The polymer including the carboxyl groups may have a melting point ("$T_m$") of about 50° C. to about 300° C.

The polymer including the carboxyl groups may be selected from a poly(alkylene-co-acrylic acid) such as poly (ethylene-co-acrylic acid), and the like, a poly(alkylene-co-methacrylic acid) such as poly(ethylene-co-methacrylic acid), and the like, and a combination thereof.

The metal compound may be an organometallic compound, an organic salt, or an inorganic salt including a metal selected from an alkaline-earth metal, a rare earth element, a transition element, a Group 12 element, a Group 13 element, and a combination thereof.

The metal compound may be an organometallic compound, an organic salt, or an inorganic salt including a metal selected from Mg, Ca, Sc, Ti, V, Cr, Mn, Fe, Co, Ni, Cu, Zn, Ga, Sr, Y, Zr, Nb, Mo, Cd, In, Ba, Au, Hg, Tl, and a combination thereof.

According to another embodiment, provided is a method of manufacturing a semiconductor nanocrystal-polymer composite that includes: dispersing a polymer including a plurality of carboxyl groups (—COOH) in an organic solvent to provide a polymer dispersion; contacting the polymer dispersion with a semiconductor nanocrystal and a metal compound comprising the metal cation bindable with a carboxyl group of the plurality of carboxyl groups of the polymer to provide a mixture; and drying the mixture to prepare the semiconductor nanocrystal-polymer composite. The mixture may be cooled before drying.

The polymer including the plurality of carboxyl groups, the semiconductor nanocrystal, and the metal compound are disclosed above.

Another embodiment provides a composite film including a matrix in which the semiconductor nanocrystal-polymer composite is dispersed.

Still another embodiment provides an optoelectronic device including the semiconductor nanocrystal-polymer composite.

Disclosed is an optoelectronic device including a light source, and a light conversion layer including the semiconductor nanocrystal-polymer composite disposed on the light source.

A polymer layer including an organic/inorganic hybrid polymer may be further disposed between the light source and the semiconductor nanocrystal-polymer composite.

The optoelectronic device may include a light source; a first matrix disposed on the light source; a transparent plate disposed on and covering the first matrix; and a light conversion layer including the semiconductor nanocrystal-polymer composite and a second matrix, each disposed on the transparent plate.

The optoelectronic device may further include an organic/inorganic hybrid polymer layer including an organic/inorganic hybrid polymer, wherein the organic/inorganic hybrid polymer layer has a surface which is substantially parallel to a surface of the light source and wherein the organic/inorganic hybrid polymer layer is between the light source and the transparent plate.

The semiconductor nanocrystal-polymer composite may effectively protect the semiconductor nanocrystal to improve device efficiency and thermal stability.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
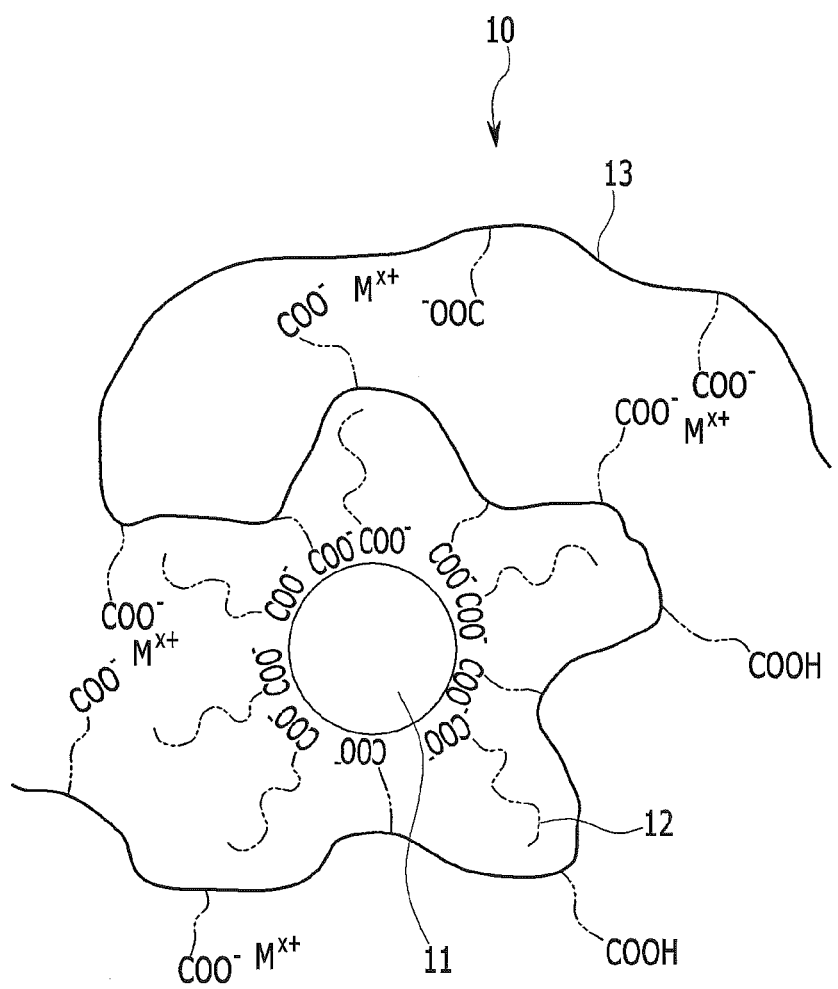
FIG. 1 is a schematic view of an embodiment of a semiconductor nanocrystal-polymer composite.

This disclosure will be described more fully hereinafter in the following detailed description of this disclosure, in which some but not all embodiments of this disclosure are disclosed. This disclosure may be embodied in many different forms and is not to be construed as limited to the embodiments set forth herein; rather, these embodiments are provided so that this disclosure will fully convey the scope of the invention to those skilled in the art. Like reference numerals refer to like elements throughout.

Exemplary embodiments are described herein with reference to cross section illustrations that are schematic illustrations of idealized embodiments. In the drawings, the thickness of layers, films, panels, regions, etc., are exaggerated for clarity. Variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers, and/or sections should not be limited by these terms. These terms are only used to distinguish one element, component, region, layer, or section from another element, component, region, layer or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The term "substituted" means that a compound or group is substituted with at least one (e.g., 1, 2, 3, or 4) substituent independently selected from a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (e.g., —F, —Cl, —Br or —I), a hydroxyl group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—C(=O)OH) or a salt thereof (—C(=O)OM, wherein M is an organic or inorganic cation), a sulfonic acid group (—SO$_3$H) or a salt thereof (—SO$_3$M, wherein M is an organic or inorganic cation), or a phosphoric acid group (—PO$_3$H$_2$) or a salt thereof (—PO$_3$MH or —PO$_3$M$_2$ wherein M is an organic or inorganic cation), instead of hydrogen, provided that the substituted atom's normal valence is not exceeded.

As used herein, when a definition is not otherwise provided, the prefix "hetero" refers to a compound or group that includes a heteroatom (e.g., 1 to 4 heteroatoms, each independently N, O, S, Si, or P), in a chain or in a ring if the group is cyclic. The total number of ring members may be 3 to 10. If multiple rings are present, each ring may independently be aromatic, saturated, or partially unsaturated, and multiple rings, if present, may be fused, pendant, spirocyclic, or a combination thereof. Heterocycloalkyl groups include at least one non-aromatic ring that contains a heteroatom ring member. Heteroaryl groups include at least one aromatic ring that contains a heteroatom ring member. Non-aromatic and/or carbocyclic rings may also be present in a heteroaryl group, provided that at least one ring is both aromatic and contains a ring member that is a heteroatom.

"Alkyl" means a straight or branched chain, saturated, monovalent hydrocarbon group (e.g., methyl or hexyl).

As used herein, the term "alkylene" refers to a straight or branched saturated, aliphatic hydrocarbon group having a valence of at least two, optionally substituted with one or more substituents where indicated, provided that the valence of the alkylene group is not exceeded.

"Alkenyl" means a straight or branched chain, monovalent hydrocarbon group having at least one carbon-carbon double bond (e.g., ethenyl (—HC=CH$_2$)).

"Alkenylene" means a straight or branched chain, divalent hydrocarbon group having at least one carbon-carbon double bond (e.g., ethenylene (—HC=CH—)).

"Alkynyl" means a straight or branched chain, monovalent hydrocarbon group having at least one carbon-carbon triple bond (e.g., ethynyl).

"Aryl," means a cyclic moiety in which all ring members are carbon and at least one ring is aromatic, the moiety having the specified number of carbon atoms, specifically 6 to 24 carbon atoms, more specifically 6 to 12 carbon atoms. More than one ring may be present, and any additional rings may be independently aromatic, saturated or partially unsaturated, and may be fused, pendant, spirocyclic or a combination thereof.

"Alkylaryl" means an alkyl group covalently linked to a substituted or unsubstituted aryl group that is linked to a compound.

"Aryloxy" means an aryl moiety that is linked via an oxygen (i.e., —O-aryl).

"Cycloalkyl" means a monovalent group having one or more saturated rings in which all ring members are carbon (e.g., cyclopentyl and cyclohexyl).

"Cycloalkenyl" means a monovalent group having one or more rings and one or more carbon-carbon double bond in the ring, wherein all ring members are carbon (e.g., cyclopentyl and cyclohexyl).

"Cycloalkynyl" means a stable aliphatic monocyclic or polycyclic group having at least one carbon-carbon triple bond, wherein all ring members are carbon (e.g., cyclohexynyl).

As used herein, the term "aliphatic organic group" refers to a C1 to C30 linear or branched hydrocarbon group, which may be an alkyl, alkenyl, or alkynyl group, for example.

The term "aromatic organic group" refers to a C6 to C30 aryl group or a C2 to C30 heteroaryl group.

The term "alicyclic organic group" refers to a cyclic hydrocarbon having properties of an aliphatic group, and may be a C3 to C30 cycloalkyl group, a C3 to C30 cycloalkenyl group, or a C3 to C30 cycloalkynyl group, for example.

As used herein, the term "combination thereof" refers to a combination comprising at least one of the named constituents, components, compounds, or elements, optionally together with a like component, compound, or element not named. The combination may be a mixture, a stacked structure, a composite, an alloy, a blend, or a reaction product, for example.

As used herein, "(meth)acrylic acid" refers to acrylic acid and methacrylic acid, "(meth)acrylate" refers to acrylate and methacrylate, and "(meth)acryloyloxy" refers to acryloyloxy and methacryloyloxy.

"Rare earth" means the fifteen lanthanide elements, i.e., atomic numbers 57 to 71, plus scandium and yttrium.

"Transition element" means an element of Groups 3 to 12 of the Periodic Table of the Elements.

Hereinafter, referring to FIG. 1, the semiconductor nanocrystal-polymer composite according to an embodiment is described in further detail.

FIG. 1 is a schematic view of an embodiment of a semiconductor nanocrystal-polymer composite.

Referring to FIG. 1, the semiconductor nanocrystal-polymer composite 10 according to an embodiment includes a semiconductor nanocrystal 11, an organic ligand 12, a polymer 13 including a plurality of carboxylate anion groups (—COO$^-$) bindable to a surface of the semiconductor nanocrystal 11, and a metal cation M$^{x+}$ bindable to a carboxylate anion group of the plurality of carboxylate anion groups, wherein x is an oxidation number of M, wherein x can be an integer.

While not wanting to be bound by theory, it is believed that a carboxylate anion group of the polymer 13 binds to the surface of the semiconductor nanocrystal, stabilizing the semiconductor nanocrystal, for example preventing aggregation when dispersed in a polymer matrix, preventing dissociation of the organic ligand 12, or both. Also, it is understood that a different carboxylate anion group of the polymer 13 binds to the metal cation, stabilizing the polymer, for example preventing aggregation when dispersed in a polymer matrix, preventing dissociation of the organic ligand 12, or both. Thus in an embodiment, the polymer comprises a first carboxylate anion group bonded to the surface of the semiconductor nanocrystal and a second carboxylate anion group bonded to the metal cation. The disclosed composite may be used to provide a light emitting diode having surprisingly improved stability, luminescence intensity, and external quantum efficiency.

The metal cation M$^{x+}$ has an oxidation state x, and x may be greater than or equal to about 2, specifically about 2 to about 8, more specifically about 2 to about 4, provided that the valence of the metal is not exceeded.

The semiconductor nanocrystal 11 may be a semiconductor nanocrystal which emits red, green, yellow, or blue light. The semiconductor nanocrystal may be selected from a Group II-VI compound, a Group III-V compound, a Group IV-VI compound, a Group IV element, a Group IV compound, and a combination thereof, wherein the term "Group" refers to a group of the Periodic Table of the Elements.

The Group II-VI compound includes a Group II element and a Group VI element, and may include a binary compound selected from CdSe, CdTe, ZnS, ZnSe, ZnTe, ZnO, HgS, HgSe, HgTe, MgSe, MgS, and a combination thereof; a ternary compound selected from CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; or a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof. The Group III-V compound includes a Group III element and a Group V element, and may include a binary compound selected from GaN, GaP, GaAs, GaSb, AlN, AlP, AlAs, AlSb, InN, InP, InAs, InSb, and a combination thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, and a combination thereof; or a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group IV-VI compound includes a Group IV element and a Group VI element, and may include a binary compound selected from SnS, SnSe, SnTe, PbS, PbSe, PbTe, and a combination thereof; a ternary compound selected from SnSeS, SnSeTe, SnSTe, PbSeS, PbSeTe, PbSTe, SnPbS, SnPbSe, SnPbTe, and a combination thereof; or a quaternary compound selected from SnPbSSe, SnPbSeTe, SnPbSTe, and a combination thereof. The Group IV element includes Si, Ge, and a combination thereof. The Group IV compound may include a binary compound selected from SiC, SiGe, and a combination thereof.

Herein, the element, the binary compound, the ternary compound, or the quaternary compound may be present in a particle having a substantially uniform concentration, or may be present in a particle having different concentration distributions in the same particle. Thus a particle may have a gradient of the semiconductor, a concentration of the semiconductor may vary in a direction towards a center of the particle, and the concentration may increase or decrease in a direction towards a center of the particle. The concentration may vary homogeneously or inhomogeneously. In an embodiment, each particle may have a core/shell structure in which a first semiconductor nanocrystal is surrounded by a second semiconductor nanocrystal. The core and shell may have an interface, and an element of at least one of the core or the shell may have a concentration gradient that decreases in a direction from the surface of the particle to a center of the particle.

In addition, the semiconductor nanocrystal may have a structure including a semiconductor nanocrystal core and a multi-layer shell surrounding the same. The multi-layer shell may have a two or more layered shell structure. Each layer may have a single composition, may be an alloy, or may have a concentration gradient.

In addition, the semiconductor nanocrystal may have a structure effectively showing the quantum confinement effect in an embodiment in which the material composition for the shell has a wider energy band gap than that of the core. In an embodiment having a multi-layered shell, the energy of a band gap of the shell further from the core is wider than that of the shell closer to the core. The semiconductor nanocrystal may provide light having an ultraviolet (UV) to infrared wavelength.

The semiconductor nanocrystal may have a quantum efficiency of about 30% to about 100%, specifically about 40% to about 100%, for example, about 50% or more, or 70% or more, or about 90% or more. Within the foregoing range, a luminous efficiency of a device may be improved.

In addition, the full width half maximum (FWHM) of the light emitting wavelength spectrum of the semiconductor nanocrystal may be selected to be narrower or wider. The semiconductor nanocrystal may be selected to have a narrower spectrum in order to improve the color purity or the color reproducibility in a display. The semiconductor nanocrystal may have the FWHM of light emitting wavelength spectrum of about 50 nanometers (nm) or less, for example, about 40 nm or less, or about 30 nm or less, specifically about 10 to about 50 nm, specifically about 15 to about 40 nm. In the foregoing range, the color purity or the color reproducibility of device may be improved. In addition, when the semiconductor nanocrystal is used for lighting or the like, a combination of semiconductor nanocrystals having the various light emitting wavelengths may be provided in order to improve the color rendering index (hereinafter, "CRI") alternatively or in combination with a wider FWHM. In an embodiment, the FWHM may range from about 50 nm to about 400 nm, specifically about 100 nm to about 200 nm, more specifically about 125 nm to about 175 nm.

The semiconductor nanocrystal may have a particle diameter (e.g., an average largest particle diameter) ranging from about 1 nanometer (nm) to about 100 nm, and specifically about 1 nm to about 20 nm.

In addition, a shape of the semiconductor nanocrystal is not specifically limited, and may be selected from spherical, rectilinear, curvilinear, pyramidal, multi-armed, cubic, and a combination thereof, and the semiconductor nanocrystal may be a nanoparticle, nanotube, nanowire, nanofiber, nanoplate particle, or the like.

The semiconductor nanocrystal may be synthesized by a variety of methods known in the art. For example, the semiconductor nanocrystal may be synthesized according to the following method. The method of synthesizing the semiconductor nanocrystal is not limited to the following method, and it may be synthesized according to any suitable method.

For example, a nano-sized semiconductor nanocrystal may be synthesized according to a wet chemical process in which a precursor material is contacted with an organic solvent to provide the nanoparticles. This is a method of controlling crystal development by naturally coordinating an organic solvent or an organic ligand on the surface of the semiconductor nanocrystal while the crystal is grown. Excess organic ligands that are not coordinated on the surface of the nanocrystal may be removed by washing and centrifugation. Multiple washings, specifically 2 to about 4 washings, may be used if desired. After removing the excess organic ligands, the amount of organic ligands coordinated on the surface of the semiconductor nanocrystal may be about 50 weight percent (wt %) or less of the semiconductor nanocrystal by weight, for example about 10 to about 50 wt %, based on the total weight of the organic ligands and the semiconductor nanocrystal. For example, in an embodiment in which the semiconductor nanocrystal has a size of about 20 nm or less, the coordinated organic ligands may be present in an amount of about 10 to about 50 wt %, for example, about 15 to about 30 wt %, based on the total weight of the organic ligands and the semiconductor nanocrystal. The organic ligands may be a monomer or an oligomer having a molecular weight of about 300 Daltons ("Da") or more, specifically about 300 Da to about 3000 Da, more specifically about 400 Da to about 2500 Da, or a polymer having a weight average molecular weight (Mw) of about 5000 Da or more, specifically about 3000 Da to about 50,000 Da, more specifically about 4000 Da to about 40,000 Da.

In addition, a semiconductor nanocrystal-matrix composite including a matrix in which the semiconductor nanocrystal is dispersed may be prepared. The semiconductor nanocrystal-matrix composite may be applied to various fields by contacting the synthesized semiconductor nanocrystal with a matrix precursor and curing the matrix precursor. Silicone resins have been used as the matrix. However, silicone resin has insufficient compatibility with an organic ligand present on the surface of the semiconductor nanocrystal. While not wanting to be bound by theory, it is understood that when a silicon resin is used, the semiconductor nanocrystal may aggregate, resulting in a loss of organic ligands present on the surface of the semiconductor nanocrystal, decreasing device efficiency.

As shown in FIG. 1, in addition to the organic ligand 12, the semiconductor nanocrystal 11 is coated with, e.g., bonded to or contacted with, a polymer 13 having a plurality of carboxylate anion groups which are bindable to the surface of the semiconductor nanocrystal. Without being bound by theory, it is believed that at least a portion of the carboxylate anion groups of polymer 13 are bound to a surface of the semiconductor nanocrystal and at least a portion of the carboxylate anion groups of polymer 13 are bound to a cation $M^{x+}$. Contacting the semiconductor nanocrystal 11 with the polymer 13 therefore provides a stabilized composite as described above. Also as shown in FIG. 1, the organic ligand 12 may be present on and bound to the surface of the semiconductor nanocrystal 11. The carboxylate anion groups may act as an organic ligand on the surface of the semiconductor nanocrystal 11 and may passivate the semiconductor nanocrystal 11.

The polymer having, i.e., comprising the carboxylate anion groups 13 may include about 1 to about 100 mol %, specifically about 1 to about 90 mol %, more specifically about 2 to about 50 mol %, even more specifically about 4 to about 20 mol % of the carboxylate anion group-containing structural unit in the polymer, based on the total moles of structural units in the polymer. When the carboxylate anion group-containing structural unit in the polymer is included within the foregoing range, the stability of semiconductor nanocrystal-polymer composite 10 may be improved. Alternatively, or in addition, the polymer having the carboxylate anion groups 13 may include about 1 to about 100 wt %, specifically about 1 to about 90 wt %, more specifically about 2 to about 50 wt %, even more specifically about 2 to about 20 wt % of the carboxylate anion group-containing structural unit in the polymer, based on the total weight of the polymer. When the carboxylate anion group-containing structural unit in the polymer is included within the foregoing range, the stability of semiconductor nanocrystal-polymer composite 10 may be improved.

The polymer comprising the carboxylate anion groups 13 may have a melting point ("$T_m$") of about 50° C. to about 400° C., specifically about 60° C. to about 350° C., more specifically about 70° C. to about 300° C. When the melting point is within the foregoing range, the polymer comprising the carboxylate anion groups 13 may be stably disposed, e.g., coated on, an entirety or on a portion of a surface of the semiconductor nanocrystal 11.

The polymer having the carboxylate anion groups 13 is a polymer having a carboxylate anion group in the main chain or the side chain (e.g, a graft) of a long aliphatic chain. The polymer having the carboxylate anion groups 13 may be a polymer including an alkylene structural unit and a structural unit represented by the following Chemical Formula 1.

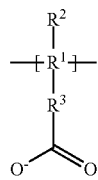

Chemical Formula 1

In Chemical Formula 1, $R^1$ is a substituted or unsubstituted C2 to C20 linear or branched alkylene group, for example a substituted or unsubstituted C2 to C10 linear or branched alkylene group, $R^2$ is hydrogen or a methyl group, and $R^3$ is a single bond; a substituted or unsubstituted C1 to C50 alkylene group; a substituted or unsubstituted C2 to C50 alkenylene group; a C2 to C50 alkylene group wherein at least one methylene group (—$CH_2$—) is replaced with a sulfonyl group (—$SO_2$—), a carbonyl group (—C(O)—), an ether group (—O—), a sulfide group (—S—), a sulfoxide group (—S(O)—), an ester group (—C(=O)O—), an amide group (—C(=O)NR—, wherein R is hydrogen or a C1 to C10 alkyl group), an amino group (—NR—, wherein R is hydrogen or a C1 to C10 alkyl group), or a combination thereof; or a C3 to C50 alkenylene group wherein at least one methylene group (—$CH_2$—) is replaced with a sulfonyl group (—$SO_2$—), a carbonyl group (—C(O)—), an ether group (—O—), a sulfide group (—S—), a sulfoxide group (—SO—), an ester group (—C(=O)O—), an amide group of the formula —C(=O)NR—, wherein R is hydrogen or a C1 to C10 alkyl group, an amino group (—NR—, wherein R is hydrogen or a C1 to C10 alkyl group, or a combination thereof.

In a specific embodiment $R^1$ is an unsubstituted C2 to C5 linear or branched alkylene group, for example an unsubstituted C2 to C4 unbranched alkylene group, and $R^3$ is a single bond, a substituted or unsubstituted C1 to C10 alkylene group; a substituted or unsubstituted C2 to C10 alkenylene group; a C2 to C10 alkylene group wherein at least one methylene group (—$CH_2$—) is replaced with a sulfonyl group (—$SO_2$—), a carbonyl group (—C(O)—), an ether group (—O—), a sulfide group (—S—), a sulfoxide group (—S(O)—), an ester group (—C(=O)O—), an amide group (—C(=O)NR—, wherein R is hydrogen or a C1 to C10 alkyl group), an amino group (—NR—, wherein R is hydrogen or a C1 to C10 alkyl group), or a combination thereof; or a C3 to C10 alkenylene group wherein at least one methylene group (—$CH_2$—) is replaced with a sulfonyl group (—$SO_2$—), a carbonyl group (—C(O)—), an ether group (—O—), a sulfide group (—S—), a sulfoxide group (—SO—), an ester group (—C(=O)O—), an amide group (—C(=O)NR—, wherein R is hydrogen or a C1 to C10 alkyl group), an amino group (—NR—, wherein R is hydrogen or a C1 to C10 alkyl group), or a combination thereof.

In another specific embodiment, $R^1$ is an unsubstituted C2 alkylene group, and $R^3$ is a single bond.

The alkylene structural unit and the structural unit represented by Chemical Formula 1 may be randomly arranged to provide a random copolymer, or may be arranged in blocks to provide a block copolymer, but the arrangement of the structural units is not specifically limited thereto. The polymers may be linear, branched, graft, dendritic, or star polymers, for example, but is not specifically limited thereto.

The polymer having the carboxylate anion groups 13 may be an ionized polymer of a poly(alkylene-co-(meth)acrylic acid) selected from a poly(alkylene-co-acrylic acid) such as poly(ethylene-co-acrylic acid), poly(propylene-co-acrylic acid), poly(butylene-co-acrylic acid), and the like, a poly(alkylene-co-methacrylic acid) such as poly(ethylene-co-methacrylic acid), poly(propylene-co-methacrylic acid), poly(butylene-co-methacrylic acid), and the like, and a combination thereof.

The polymer having the carboxylate anion groups 13 may be present in an amount of about 50 to about 10,000 parts by weight, specifically about 75 to about 5,000 parts by weight, more specifically about 100 to about 1000 parts by weight, based on 100 parts by weight of the semiconductor nanocrystal 11. When the polymer is present within the foregoing range, the stability of the semiconductor nanocrystal 11 may be sufficient.

The metal cation ($M^{x+}$) may be bonded with a carboxylate anion group that is not bonded with the semiconductor nanocrystal 11. Thus the metal cation is bindable to a carboxylate anion group of the plurality of carboxylate anion groups. While not wanting to be bound by theory, it is understood that bonding the metal cation to the carboxylate anion group increases the melting point (m.p.) of the polymer having the carboxylate anion groups 13 and improves the thermal stability of the polymer. The metal cation ($M^{x+}$) may form a coordinate bond or an ionic bond with a carboxylate anion group so that the chain structure of the polymer 13 is more closely adhered to provide a network. In addition, any amount of the polymer that is weakly bonded to the semiconductor nanocrystal 11 may be eliminated from the semiconductor nanocrystal-polymer composite 10, by washing, for example.

The metal cation ($M^{x+}$) may be a cation of a metal selected from an alkaline-earth metal, a rare earth element, a transition element, a Group 12 element, a Group 13 element, and a combination thereof. The metal cation may be a cation of a metal selected from Mg, Ca, Sc, Ti, V, Cr, Mn, Fe, Co, Ni, Cu, Zn, Ga, Sr, Y, Zr, Nb, Mo, Cd, In, Ba, Au, Hg, Tl, and a combination thereof. In an embodiment, the metal cation may be a polyvalent metal cation, and may be a divalent or trivalent metal cation, for example.

The metal cation ($M^{x+}$) may be present in an amount of about 0.1 to about 1.5 moles, specifically, at about 0.3 to about 1.5 moles, more specifically about 0.4 to about 1.3 moles, based on 1 mol of the carboxylate anion group of the polymer. Within the foregoing range, the metal cation ($M^{x+}$) may be suitably bonded with the carboxylate anion group.

The semiconductor nanocrystal-polymer composite 10 may further include a nanoparticle selected from a metal nanocrystal, a metal oxide nanocrystal, and a combination thereof in addition to the semiconductor nanocrystal 11. The nanoparticle may be present in a core of the semiconductor nanocrystal-polymer composite 10. The metal nanocrystal may include an element selected from Au, Ag, Pd, Pt, Co, Fe, Ni, Cu, Mn, and a combination thereof, may be an alloy thereof, and the metal oxide nanocrystal may be selected from $SiO_2$, $TiO_2$, $SnO_2$, $ZnO$, $In_2O_3$—$SnO_2$, $Al_2O_3$, $WO_3$, $Nb_2O_5$, $TiSrO_3$, $InTiO_2$, $Fe_2O_3$, $ZrO_2$, $HfO_2$, and a combination thereof. The metal nanocrystal and the metal oxide nanocrystal may have a size of about 1 nm to about 100 nm, specifically about 10 nm to about 90 nm. The metal nanocrystal and the metal oxide nanocrystal may be included in an amount of about 1 to about 50 parts by weight, specifically about 2 to about 40 parts by weight, more specifically about 3 to about 30 parts by weight, based on 100 parts by weight of the semiconductor nanocrystal.

The semiconductor nanocrystal-polymer composite 10 may be prepared by contacting, e.g., reacting, the semiconductor nanocrystal 11, a polymer having a plurality of carboxyl groups (—COOH), and a metal compound including a metal cation bindable to a carboxyl group of the plurality of carboxyl groups, followed by drying to prepare the semiconductor nanocrystal-polymer composite.

In an embodiment, the polymer having the carboxyl groups (—COOH) may be dispersed in an organic solvent to provide a polymer dispersion, the polymer dispersion may be combined with a semiconductor nanocrystal to provide a mixture, and the mixture may be added to a metal compound. The metal compound provides metal cations bindable to the carboxyl group. The product may be dried to provide a semiconductor nanocrystal-polymer composite 10. If desired, cooling may be performed before or after the drying of the product.

The polymer having the carboxyl groups may be a polymer including an alkylene structural unit, (for example, a polyalkylene structural unit if present as a block) and a (meth)acrylic acid structural unit (for example, a poly(meth)acrylic acid structural unit if present as a block). These structural units may be randomly arranged to provide a random copolymer, or may be arranged in blocks to provide a block copolymer, but the arrangement of the structural units is not limited thereto. As used herein, "randomly arranged" means that greater than or equal to 95 mol %, specifically greater than or equal to 99 mol %, or more specifically greater than or equal to 99.5 mol % of the alkylene and (meth)acrylic acid structural units are randomly distributed as determined by proton nuclear magnetic resonance (NMR) spectroscopy. The polymer having the carboxyl groups may be selected from poly(ethylene-co-acrylic acid), poly(ethylene-co-methacrylic acid), poly(propylene-co-acrylic acid), poly(propylene-co-methacrylic acid), poly(butylene-co-acrylic acid), poly(butylene-co-methacrylic acid), and a combination thereof.

The polymer having the carboxyl groups may include about 1 to about 100 mol %, specifically about 1 to about 90 mol %, more specifically about 2 to about 50 mol %, and even more specifically about 4 to about 20 mol %, of the carboxyl group-containing structural unit in the polymer, based on the total moles of the structural units in the polymer. When the structural unit having the carboxyl group is included in the polymer within the foregoing range, the thermal stability of the semiconductor nanocrystal-polymer composite 10 may be improved.

The polymer having the carboxyl groups may be included in an amount of about 50 to about 10,000 parts by weight, and specifically about 100 to about 1000 parts by weight, based on 100 parts by weight of the semiconductor nanocrystal. Within the foregoing range, the thermal stability of the semiconductor nanocrystal 11 may be sufficient.

The polymer having the carboxyl groups may have a melting point ("$T_m$") of about 50° C. to about 300° C., specifically about 60° C. to about 200° C., and more specifically about 70° C. to about 200° C. When the polymer has a melting point within the above range, the polymer having the carboxylate anion groups 13 may stably coat the semiconductor nanocrystal 11.

The polymer dispersion may further include an ionic polymer including a carboxylate anion group. The ionic polymer is a compound including a metal such as sodium, zinc, indium, gallium, or the like instead of hydrogen of the carboxyl group in the polymer having carboxyl group. The ionic polymer may include a poly(ethylene-co-acrylic acid) zinc salt, a poly(ethylene-co-methacrylic acid) zinc salt, or the like. The ionic polymer may be included in about 1 to about 90 wt %, specifically about 2 to 80 wt %, more specifically about 3 to 50 wt %, based on a total weight of the polymer having carboxyl groups and the ionic polymer.

The organic solvent for the polymer dispersion may include a solvent having a high boiling point, for example, toluene, benzene, chloroform, trioctylamine, xylene, dimethyl sulfoxide, or the like. Suitable solvents may include mononitriles, such as valeronitrile, capronitrile, and benzonitrile. The solvent may be a glyme, such as diethylene glycol dimethyl ether (diglyme), or trimethylene glycol dimethyl ether (triglyme). Other representative solvents include alcohols (e.g., methanol, ethanol, butanol); aldehydes (e.g., acetaldehydes, propionaldehydes), formamides (e.g., N,N-dimethylformamide); ketones (e.g., β-bromoethyl isopropyl ketone); acetonitrile; sulfoxides (e.g., dimethylsulfoxide, diphenylsulfoxide, ethyl phenyl sulfoxide); sulfones (e.g., diethyl sulfone, phenyl 7-quinolylsulfone); thiophenes (e.g., thiophene 1-oxide); acetates (e.g., ethylene glycol diacetate, n-hexyl acetate, 2-ethylhexyl acetate); and amides (e.g., propanamide, benzamide). A combination comprising at least one of the foregoing solvents may be used.

The polymer dispersion may be prepared under an inert atmosphere.

For example, the polymer dispersion may be prepared by dissolving the polymer having the carboxyl groups in a solvent under an inert atmosphere, such as a nitrogen atmosphere. The polymer dispersion may be prepared at a temperature of about 20° C. to about 200° C., specifically about 25° C. to about 180° C., more specifically about 30° C. to about 170° C.

The semiconductor nanocrystal may be contacted with the polymer dispersion to provide a mixture, and the mixture may be heat treated under the inert atmosphere such as a nitrogen atmosphere. The heat treatment may be performed at about 40° C. to about 200° C., specifically about 50° C. to about 180° C., more specifically about 60° C. to about 160° C.

The adding of a metal compound including a metal cation bindable to the carboxyl group into the mixture may be performed with heat treatment under the inert atmosphere such as the nitrogen atmosphere. The heat treatment may be performed at about 40° C. to about 200° C., specifically about 50° C. to about 180° C., more specifically about 60° C. to about 160° C.

The heat treatment may be carried out at a temperature higher than the subsequent drying process.

The drying process may be performed at about 20° C. to about 100° C., specifically about 25° C. to about 80° C., more specifically at room temperature (about 23° C. to about 25° C.). The drying process may be performed under a vacuum atmosphere or with blowing air or $N_2$.

When at least one of the processes of manufacturing the polymer dispersion, contacting the semiconductor nanocrystal with the polymer dispersion, and adding the metal compound is performed with the heat treatment, the cooling process may be performed before the drying process. For example, after the adding of the metal compound and the heat treatment, the product may be optionally cooled, e.g., cooled from the temperature of the heat treatment, e.g., about 40° C. to about 200° C., to about 0° C. to about 100° C. In an embodiment, the cooling process may be performed at a temperature of about 0° C. to about 40° C. Alternatively, the cooling may be performed after the drying.

The metal compound may be an organometallic compound, an organic salt, or an inorganic salt including a metal selected from an alkaline-earth metal, a rare earth element, a transition element, a Group 12 element, a Group 13 element, and a combination thereof. The metal compound may be an organometallic compound, an organic salt, or an inorganic salt including a metal selected from Mg, Ca, Sc, Ti, V, Cr, Mn, Fe, Co, Ni, Cu, Zn, Ga, Rb, Sr, Y, Zr, Nb, Mo, Cd, In, Ba, Au, Hg, Tl, and a combination thereof. The organometallic compound may include dimethyl zinc, diethyl zinc, zinc acetate, zinc stearate, zinc acetylacetonate, dimethyl cadmium, ferrocene, and the like, but is not limited thereto. The organic salt may include a compound including an anionic group such as an acetate group, stearate group, oleate group, acetyl acetonate group, and the like, but is not limited thereto. The inorganic salt may include a halide (e.g., a chloride, bromide, and/or an iodide), nitrate, sulfate, and the like, but is not limited thereto. A combination comprising at least one of the foregoing may be used.

The semiconductor nanocrystal-polymer composite 10 is in the form of a particle.

The obtained semiconductor nanocrystal-polymer composite 10 comprising the polymer having the carboxylate anion groups 13 and the metal cation group may have excellent hardness, and may be easily ground to provide a powder having a suitable particle size and suitable flow properties. The powder of the semiconductor nanocrystal-polymer composite 10 may be easily dispersed in a matrix.

The semiconductor nanocrystal-polymer composite 10 may be combined with a matrix to provide a film. The semiconductor nanocrystal-polymer composite 10 includes the semiconductor nanocrystal 11, which is understood to be coated with the polymer having the carboxylate anion groups 13. In an embodiment, the semiconductor nanocrystal-polymer composite 10 may be dispersed in the matrix to provide the film. While not wanting to be bound by theory, it is understood that the powder properties of the semiconductor nanocrystal-polymer composite 10 facilitate combining with a matrix to provide a composite film.

The matrix may include a silicone resin; an epoxy resin; a (meth)acrylate-based resin; silica; a metal oxide; a copolymer of a first monomer including at least two thiol (—SH) groups at a terminal end and a second monomer including at least two carbon-carbon unsaturated bond-containing group at a terminal end; or a combination thereof.

The metal oxide may include alumina, titania, zirconia, and the like.

The first monomer including at least two thiol (—SH) groups at a terminal end may be represented by the following Chemical Formula 2.

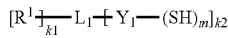

Chemical Formula 2

In Chemical Formula 2, $R^1$ is hydrogen; a substituted or unsubstituted C1 to C30 alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group including a double bond or triple bond in a ring; a substituted or unsubstituted C3 to C30 heterocycloalkyl group including a double bond or triple bond in a ring; a C3 to C30 alicyclic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxy group; $NH_2$; a substituted or unsubstituted C1 to C30 amine group (—NRR', wherein R and R' are independently a linear or branched C1 to C15 alkyl group); an isocyanurate group; a (meth)acrylate group; a halogen; —ROR' (wherein R is a substituted or unsubstituted C1 to C20 alkylene group and R' is hydrogen or a C1 to C20 alkyl group); —C(=O)OR' (wherein R' is hydrogen or a C1 to C20 alkyl group); —CN; or —C(=O)ONRR' (wherein R and R' are independently hydrogen or a C1 to C20 alkyl group), $L_1$ is a single bond; a substituted or unsubstituted C1 to C30 alkylene group; a substituted or unsubstituted C6 to C30 arylene group; a substituted or unsubstituted C6 to C30 heteroarylene group; a substituted or unsubstituted C3 to C30 cycloalkylene; or a substituted or unsubstituted C3 to C30 heterocycloalkylene, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene group (—$CH_2$—) is replaced with a sulfonyl group (—$S(=O)_2$—), a carbonyl group (—C(=O)—), an ether group (—O—), a sulfide group (—S—), a sulfoxide group (—S(=O)—), an ester group (—C(=O)O—), an amide group (—C(=O)NR— wherein R is hydrogen or a C1 to C10 alkyl group), an amino group (—NR— wherein R is hydrogen or a C1 to C10 alkyl group), or a combination thereof, m is an integer of greater than or equal to 1, k1 is an integer of 0 or greater than or equal to 1, k2 is an integer of greater than or equal to 1, and the sum of m and k2 is an integer of 3 or more; provided that m does not exceed the valence of $Y_1$; and provided that the sum of k1 and k2 does not exceed the valence of $L_1$.

The second monomer including at least two carbon-carbon unsaturated bond-containing group at a terminal end may be represented by the following Chemical Formula 3.

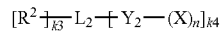

Chemical Formula 3

In Chemical Formula 3,

X is a C2 to C30 aliphatic organic group including a carbon-carbon double bond or a carbon-carbon triple bond, a C6 to C30 aromatic organic group including a carbon-carbon double bond or a carbon-carbon triple bond, or a C3 to C30 alicyclic organic group including a carbon-carbon double bond or a carbon-carbon triple bond, $R^2$ is hydrogen; a substituted or unsubstituted C1 to C30 alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group including a double bond or triple bond in a ring; a substituted or unsubstituted C3 to C30 heterocycloalkyl group including a double bond or triple bond in a ring; a C3 to C30 alicyclic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxyl group; $NH_2$; a substituted or unsubstituted C1 to C30 amine group (—NRR', wherein R and R' are independently hydrogen or a C1 to C15 alkyl group); an isocyanate group; an isocyanurate group; a (meth)acryloyloxy group; a halogen; —ROR' (wherein R is a substituted or unsubstituted C1 to C20 alkylene group and R' is hydrogen or a C1 to C20 alkyl group); an acyl halide group (—RC(=O)X, wherein R is a substituted or unsubstituted alkylene group and X is a halogen); —C(=O)OR' (wherein R' is hydrogen or a C1 to C20 alkyl group); —CN; or —C(=O)ONRR' (wherein R and R' are independently hydrogen or a C1 to C20 alkyl group), L$_2$ is a single bond, a substituted or unsubstituted C1 to C30 alkylene group, a substituted or unsubstituted C6 to C30 arylene group, a substituted or unsubstituted C6 to C30 heteroarylene group, a substituted or unsubstituted C3 to C30 cycloalkylene group, or a substituted or unsubstituted C3 to C30 heterocycloalkylene group, Y$_2$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene group (—CH$_2$—) is replaced with a sulfonyl group (—S(=O)$_2$—), a carbonyl group (—CO), an ether group (—O—), a sulfide group (—S—), a sulfoxide group (—SO—), an ester group (—C(=O)O—), an amide group (—C(=O)NR— wherein R is hydrogen or a C1 to C10 alkyl group), an amino group (—NR— wherein R is hydrogen or a C1 to C10 alkyl group), or a combination thereof, and n is an integer of greater than or equal to 1, k3 is an integer of 0 or greater than or equal to 1, k4 is an integer of greater than or equal to 1, and the sum of n and k4 is an integer of greater than or equal to 3; provided that n does not exceed the valence of Y$_2$; and provided that the sum of k3 and k4 does not exceed the valence of L$_2$.

The first monomer of the above Chemical Formula 2 may include a monomer of the following Chemical Formula 2-1.

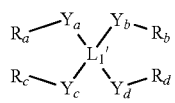

Chemical Formula 2-1

In Chemical Formula 2-1,

L$_1$' is a carbon atom, a substituted or unsubstituted C2 to C30 alkyl group of the appropriate valence, a substituted or unsubstituted C6 to C30 arylene group, for example a substituted or unsubstituted phenylene group; a substituted or unsubstituted C6 to C30 heteroarylene group; a substituted or unsubstituted C3 to C30 cycloalkylene group; or a substituted or unsubstituted C3 to C30 heterocycloalkylene group, Y$_a$ to Y$_d$ are each independently a substituted or unsubstituted C1 to C30 alkylene group; a substituted or unsubstituted C2 to C30 alkenylene group; or a C1 to C30 alkylene group or a C2 to C30 alkenylene group wherein at least one methylene group (—CH$_2$—) is replaced with a sulfonyl group (—S(=O)$_2$—), a carbonyl group (—CO—), an ether group (—O—), a sulfide group (—S—), a sulfoxide group (—SO—), an ester group (—C(=O)O—), an amide group (—C(=O)NR,— wherein R is hydrogen or a C1 to C10 alkyl group), an amino group (—NR—, wherein R is hydrogen or a C1 to C10 alkyl group), or a combination thereof, and R$_a$ to R$_d$ are each independently a thiol group (—SH) or one or more of the groups —R$_a$—Y$_a$—, —R$_b$—Y$_b$—, R$_c$—Y$_c$—, and R$_d$—Y$_d$— are R$_1$ of Chemical Formula 2, provided that at least two of Y$_a$ to Y$_d$ are as defined above and at least two of R$_a$ to R$_d$ are thiol groups (—SH).

The first monomer of the above Chemical Formula 2 may include the compounds represented by the following Chemical Formulas 2-1 to 2-5.

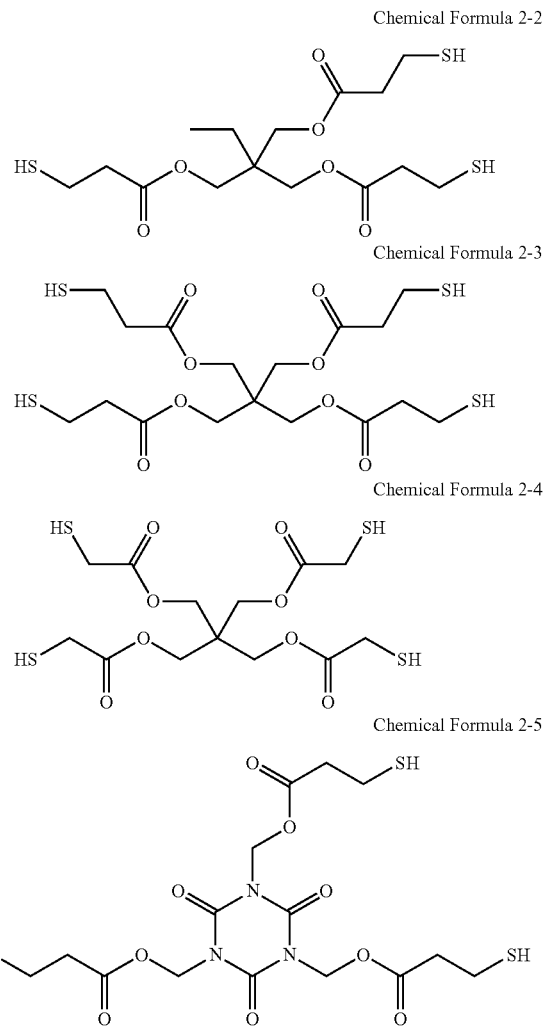

In an embodiment in Chemical Formula 3, X is an acryloyloxy group; a methacryloyloxy group; a substituted or unsubstituted C2 to C30 alkenyl group; a substituted or unsubstituted C2 to C30 alkynyl group; a substituted or unsubstituted C3 to C30 alicyclic organic group including a double bond or triple bond in a ring; a substituted or unsubstituted C3 to C30 heterocycloalkyl group including a double bond or triple bond in a ring; a C3 to C30 alicyclic group substituted with a C2 to C30 alkenyl group or a C2 to C30 alkynyl group; or a C3 to C30 heterocycloalkyl group substituted with a C2 to C30 alkenyl group or a C2 to C30 alkynyl group.

In the definitions of X of Chemical Formula 3, the alkenyl group may be selected from a vinyl group or an allyl group, and the substituted or unsubstituted C3 to C30 alicyclic organic group including a double bond or triple bond in a ring may be selected from a norbornene group, a maleimide group, a nadimide group, a tetrahydrophthalimide group, or a combination thereof.

In Chemical Formula 3, L$_2$ may be a substituted or unsubstituted pyrrolidinyl group, a substituted or unsubstituted tetrahydrofuranyl group, a substituted or unsubstituted pyridyl group, a substituted or unsubstituted pyrimidyl group, a substituted or unsubstituted piperidyl group, a substituted or unsubstituted triazinyl group, a substituted or unsubstituted trioxotriazinyl group, or a substituted or unsubstituted isocyanurate group.

The second monomer of the above Chemical Formula 3 may include the compounds represented by the following Chemical Formulas 3-1 and 3-2.

Chemical Formula 3-1

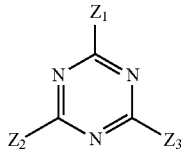

Chemical Formula 3-2

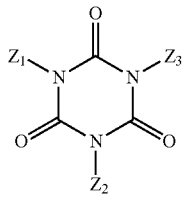

In Chemical Formulas 3-1 and 3-2, $Z_1$ to $Z_3$ are each independently *—$Y_2$—$X_n$ of the above Chemical Formula 3 wherein * represents a point of attachment to $L_2$.

Examples of the second monomer of the above Chemical Formula 3 may include the compounds represented by the following Chemical Formulas 3-3 to 3-5.

Chemical Formula 3-3

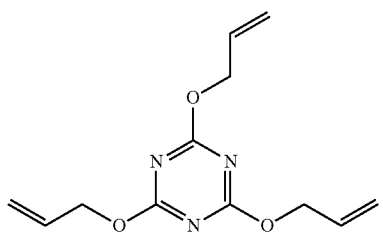

Chemical Formula 3-4

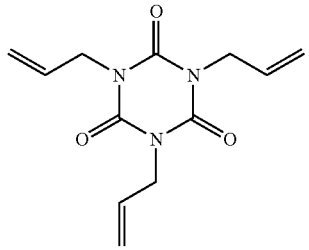

Chemical Formula 3-5

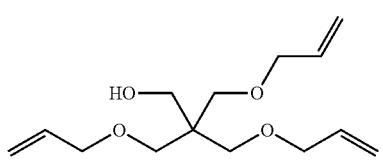

Another embodiment provides an optoelectronic device including the semiconductor nanocrystal-polymer composite. The optoelectronic device may be a light emitting diode such as a light emitting diode (LED) device or an organic light emitting diode (OLED), a memory device, a laser device, or a solar cell.

The light emitting diode may include a light source, and a light conversion layer disposed on the light source and including the semiconductor nanocrystal-polymer composite and a suitable matrix.

Hereinafter, a light emitting diode according to an embodiment is further disclosed with reference to FIG. 2.

Figure 2:
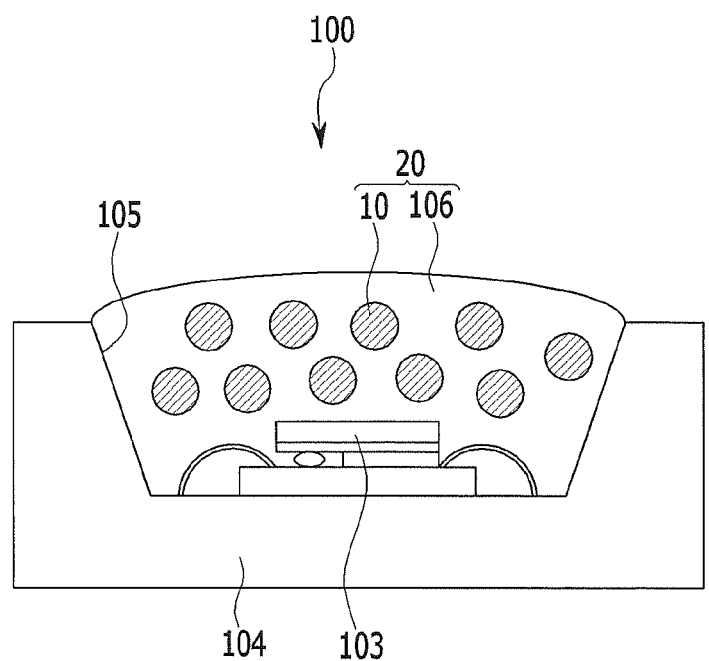
FIGS. 2 to 6 are each a cross-sectional view of an embodiment of a light emitting diode.

FIG. 2 is a cross-sectional view showing an embodiment of a light emitting diode 100. Referring to FIG. 2, the light emitting diode includes a substrate 104 including a reflector 105 (e.g., an Ag reflector), a light source 103 which provides blue or ultra-violet light and is disposed on the substrate 104, and a light conversion layer 20 including a semiconductor nanocrystal-polymer composite 10 and a matrix 106 disposed on the light source 103. The light source 103 of the light emitting diode may be a light emitting diode chip, a laser, a lamp, or the like.

The matrix 106 may comprise a matrix selected from a silicone resin; an epoxy resin; a (meth)acrylate-based resin; silica; a metal oxide; a copolymer of a first monomer including at least two thiol (—SH) groups at a terminal end and a second monomer including at least two carbon-carbon unsaturated bond-containing group at a terminal end; and a combination thereof.

The metal oxide may include alumina, titania, zirconia, and the like.

The copolymer of a first monomer including at least two thiol (—SH) groups at a terminal end and a second monomer including at least two carbon-carbon unsaturated bond-containing group at a terminal end are the same as in descriptions of the first monomer and second monomer that constitute the matrix of the composite including the semiconductor nanocrystal-polymer composite 10 and a matrix.

Figure 3:
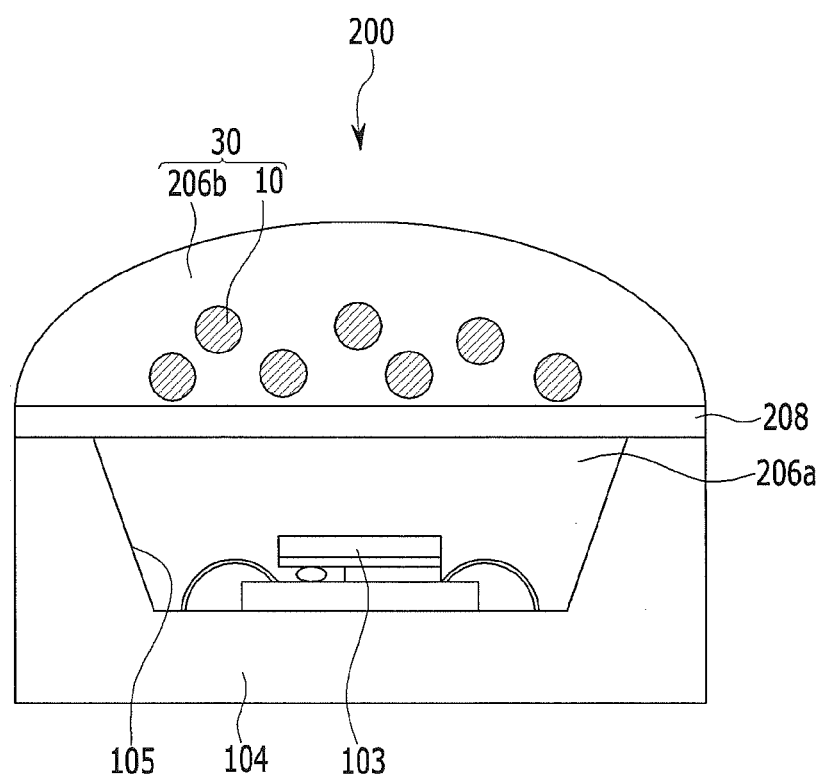

In addition, as shown in FIG. 3, in an embodiment a light emitting diode 200 includes the light source 103; a first matrix 206a disposed on the light source 103; a transparent plate 208 disposed on and covering the first matrix 206a; and a light conversion layer 30 including a second matrix 206b and the semiconductor nanocrystal-polymer composite 10 disposed on the transparent plate 208. The transparent plate 208 may comprise a material selected from a glass, a transparent polymer, and a combination thereof. The transparent plate 208 may substantially or effectively prevent deterioration of the semiconductor nanocrystal-polymer composite 10 by the light source 103.

The first matrix 206a and the second matrix 206b may each independently include matrix selected from a silicone resin; an epoxy resin; a (meth)acrylate-based resin; silica; a metal oxide; a copolymer of a first monomer including at least two thiol (—SH) groups at a terminal end and a second monomer including at least two carbon-carbon unsaturated bond-containing group at a terminal end; and a combination thereof. An embodiment in which the matrix is a silicone resin is specifically mentioned.

The metal oxide may include an oxide selected from an oxide of an element of Groups 2 to 14, and a combination thereof. The metal oxide may include an oxide selected from alumina, titania, zirconia, magnesia, silica, calcium oxide, boria, thoria, ceria, hafnia, an iron oxide, an oxide of a rare earth element, and a combination thereof. Alumina, titania, and zirconia are specifically mentioned. The copolymer of a first monomer including at least two thiol (—SH) groups at a terminal end and a second monomer including at least two carbon-carbon unsaturated bond-containing group at a terminal end are the same as in descriptions of the first monomer and second monomer that constitute the matrix of the composite including the semiconductor nanocrystal-polymer composite 10 and a matrix.

The first matrix 206a and second matrix 206b may be the same or different from each other. In an embodiment, for the first matrix 206a, a silicone resin having excellent transparency, suitable refractive index characteristics, and high thermal stability may be desirable.

Figure 4:
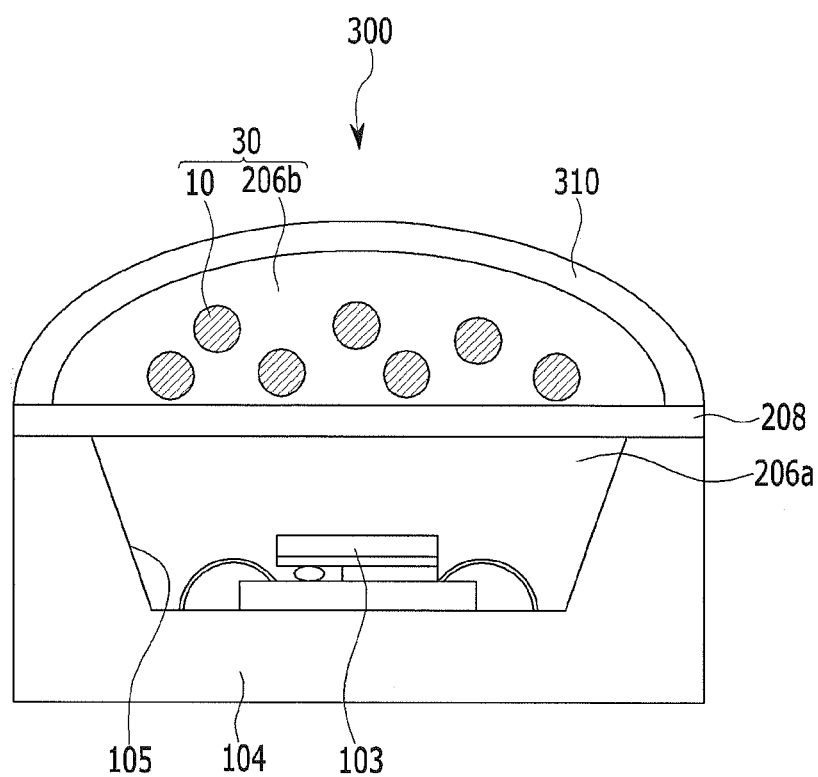

As shown in FIG. 4, in an embodiment a light emitting diode 300 may further include a polymer film 310 disposed on the light emitting diode 200, as shown in FIG. 3. The polymer film 310 may effectively protect the semiconductor nanocrystal from degradation from contact with oxygen or moisture to provide improved stability of the lighting characteristics of the device. The polymer film 310 may include a copolymer of a first monomer including at least two thiol (—SH) groups at a terminal end and a second monomer including at least two carbon-carbon unsaturated bond-containing group at a terminal end, wherein the first monomer and the second monomer are the same as in the description of the first monomer and second monomer that constitute the matrix of the composite including the semiconductor nanocrystal-polymer composite 10 and a matrix.

Figure 5:
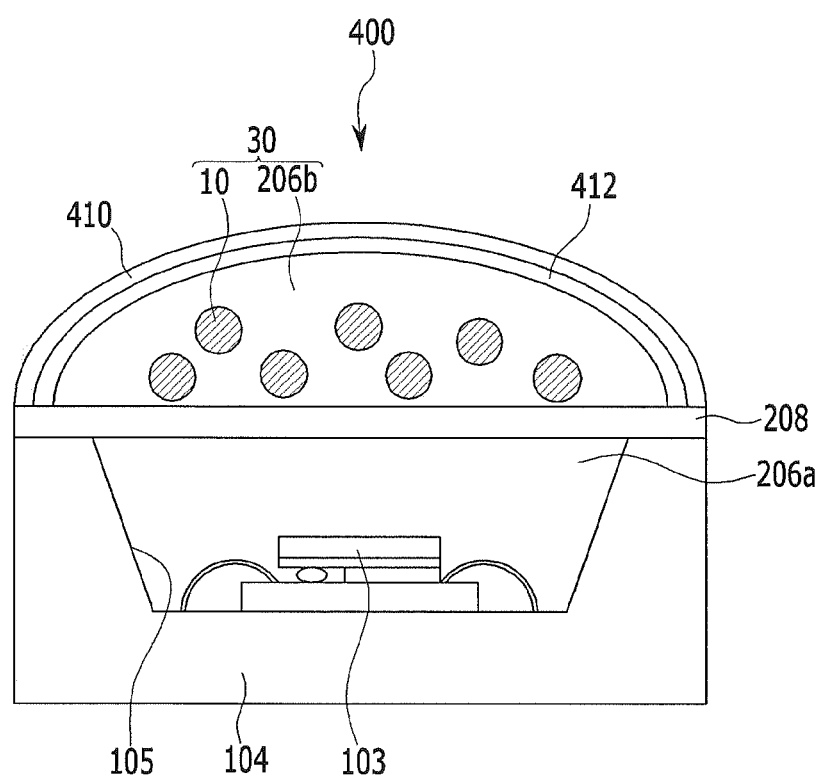

As shown in FIG. 5, in another embodiment, a light emitting diode 400 may further include a second polymer film 412 between the second matrix 206b and a first polymer film 410 (310 of the light emitting diode 300 shown in FIG. 4).

The second polymer film 412 may include an organic/inorganic hybrid polymer. The organic/inorganic hybrid polymer may include a first moiety including a siloxane bond (Si—O—Si— where each Si is tetravalent), a second moiety including a siloxane bond and at least one organic functional group, and a third moiety including a siloxane bond and a cross-linked structure of at least one reactive functional group.

The organic/inorganic hybrid polymer may further include a fourth moiety including an —O-M-O— bond (wherein M is selected from Al, Sn, Ti, Zr, Ge, B, and a combination thereof).

The organic/inorganic hybrid polymer may be a condensation polymerization polymer of a first alkoxy silane represented by the following Chemical Formula 4, a second alkoxy silane represented by the following Chemical Formula 5, and a third alkoxysilane represented by and the following Chemical Formula 6.

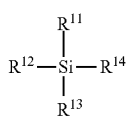

Chemical Formula 4

In Chemical Formula 4,
$R^{11}$ to $R^{14}$ are each independently a hydroxy group, a halogen, a substituted or unsubstituted C1 to C8 linear or branched alkoxy group, a substituted or unsubstituted C6 to C12 aryloxy group, a substituted or unsubstituted C2 to C10 carbonylalkyl group (-alkylC(=O)H or —C(=O)alkyl), or a substituted or unsubstituted C2 to C10 carbonylalkoxy group (—OC(=O)alkyl or —OalkylC(=O)H).

The alkoxy silane of the above Chemical Formula 4 may include tetramethoxysilane, tetraethoxysilane, tetrabutoxysilane, and the like.

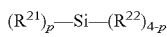  Chemical Formula 5

In Chemical Formula 5,
$R^{21}$ is a substituted or unsubstituted C6 to C20 aryl group, a substituted or unsubstituted C1 to C20 linear or branched alkyl group, for example a fluoroalkyl group, a substituted or unsubstituted C1 to C20 aminoalkyl group, a substituted or unsubstituted C2 to C20 alkynyl group, C2 to C20 alkenyl group, a substituted or unsubstituted C1 to C20 amine group, —C(=O)OR' (wherein R' is a C1 to C20 linear or branched alkyl group) or —C(=O)ONRR' (wherein R and R' are independently a C1 to C20 linear or branched alkyl group), $R^{22}$ is a hydroxy group, a halogen, a substituted or unsubstituted C1 to C8 linear or branched alkoxy group, a substituted or unsubstituted C6 to C12 aryloxy group, a substituted or unsubstituted C2 to C10 carbonylalkyl group (-alkylC(=O)H or —C(=O)alkyl), or a substituted or unsubstituted C2 to C10 carbonylalkoxy group (—OC(=O)alkyl or —OalkylC(=O)H), and p is an integer ranging from 1 to 3.

The alkoxy silane of the above Chemical Formula 5 may include methyltrimethoxysilane, ethyltrimethoxysilane, propyltrimethoxysilane, butyltrimethoxysilane, pentyltrimethoxysilane, hexyltrimethoxysilane, methyltriethoxysilane, ethyltriethoxysilane, propyltriethoxysilane, butyltriethoxysilane, pentyltriethoxysilane, hexyltriethoxysilane, dimethyldimethoxysilane, diethyldimethoxysilane, dipropyldimethoxysilane, dibutyldimethoxysilane, dipentyldimethoxysilane, dihexyldimethoxysilane, dimethyldiethoxysilane, diethyl diethoxysilane, dipropyldiethoxysilane, dibutyldiethoxysilane, dipentyldiethoxysilane, dihexyldiethoxysilane, aminomethyltrimethoxysilane, aminoethyltrimethoxysilane, aminopropyltrimethoxysilane, aminobutyltrimethoxysilane, aminopentyltrimethoxysilane, aminohexyltrimethoxysilane, aminomethyltriethoxysilane, aminoethyltriethoxysilane, aminopropyltriethoxysilane, aminobutyltriethoxysilane, aminopentyltriethoxysilane, aminohexyltriethoxysilane, phenyltrimethoxysilane, diphenyldimethoxysilane, phenyltriethoxysilane, diphenyldiethoxysilane, and the like.

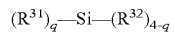  Chemical Formula 6

In Chemical Formula 6,
$R^{31}$ is a reactive functional group being capable of producing a photo-cross-linked bond or a thermal cross-linked bond, specifically a (meth)acryloxy group; an epoxy group, for example a glycidyloxy group; a spiroorthoester group; a C2 to C30 alkenyl group; a C2 to C30 alkynyl group; a substituted or unsubstituted C3 to C30 alicyclic organic group including a double bond or triple bond in a ring; a substituted or unsubstituted C3 to C30 heterocycloalkyl group including a double bond or triple bond in a ring; a C3 to C30 alicyclic group substituted with a C2 to C30 alkenyl group or a C2 to C30 alkynyl group; or a C3 to C30 heterocycloalkyl group substituted with a C2 to C30 alkenyl group or a C2 to C30 alkynyl group, $R^{32}$ is a hydroxy group, a halogen, a substituted or unsubstituted C1 to C8 linear or branched alkoxy group, a substituted or unsubstituted C6 to C12 aryloxy group, a substituted or unsubstituted C2 to C10 carbonylalkyl group (-alkylC(=O)H or —C(=O)alkyl), or a substituted or unsubstituted C2 to C10 carbonylalkoxy group (—OC(=O)alkyl or —OalkylC(=O)H), and q is an integer ranging from 1 to 3.

The organic/inorganic hybrid polymer may be a condensation polymerization polymer of the alkoxy silane compounds represented by the above Chemical Formulas 4 to 6 and an alkoxide compound represented by the following Chemical Formula 7.

  Chemical Formula 7

In Chemical Formula 7,
R is a hydroxy group, a halogen, a substituted or unsubstituted C1 to C8 linear or branched alkoxy group, for example, a methoxy group, an ethoxy group, an isopropoxy group, or a t-butoxy group, a substituted or unsubstituted C6 to C12 aryloxy group, a substituted or unsubstituted C2 to C10 carbonylalkyl group (-alkylC(=O)H or —C(=O)alkyl), or a substituted or unsubstituted C2 to C10 carbonylalkoxy group (—OC(=O)alkyl or —OalkylC(=O)H), provided at least one of R is a substituted or unsubstituted C1 to C8 linear or branched alkoxy group, M' is selected from Al, Si, Sn, Ti, Zr, Ge, B, and a combination thereof, and r is determined depending on a bonding valence of M'.

The first to third moieties may be derived from the above Chemical Formulas 4 to 6, respectively. The first alkoxy silane represented by Chemical Formula 4 undergoes condensation polymerization to provide a first moiety including a siloxane bond (—Si—O—Si—), the second alkoxy silane represented by Chemical Formula 5 undergoes condensation polymerization to provide a second moiety including a siloxane bond and at least one organic functional group, and the third alkoxy silane represented by Chemical Formula 6 undergoes condensation polymerization to provide a third moiety including a siloxane bond and a cross-linked structure of at least one reactive functional group. Therefore, the organic functional group of the second moiety may be $R^{21}$ of Chemical Formula 5, and the cross-linked organic functional group of the third moiety is provided by cross-linking of $R^{31}$, a reactive functional group being capable of producing a photo-cross-linking bond or a thermal cross-linking bond of Chemical Formula 6.

The second moiety may increase flexibility and the refractive index of the condensation polymerization polymer.

The first alkoxy silane, the second alkoxy silane and the third alkoxide compound may be used in each amount of about 0.5 wt % to about 55 wt %, about 35 wt % to about 99 wt %, and about 0.01 wt % to about 10 wt %. The first alkoxy silane may be used in an amount of about 50 wt % to about 55 wt %. When the first alkoxy silane to the third alkoxy silane undergo condensation polymerization within the above range, a polymer film having an excellent refractive index, and photo-stability and thermal stability may be formed.

The first polymer film 410 effectively protects the semiconductor nanocrystal that is weak for oxygen or moisture to stably maintain the light characteristics of the device, and the second polymer film 412 improves affinity for the first polymer film 410 and the second matrix 206b to improve interface adherence therebetween.

Figure 6:
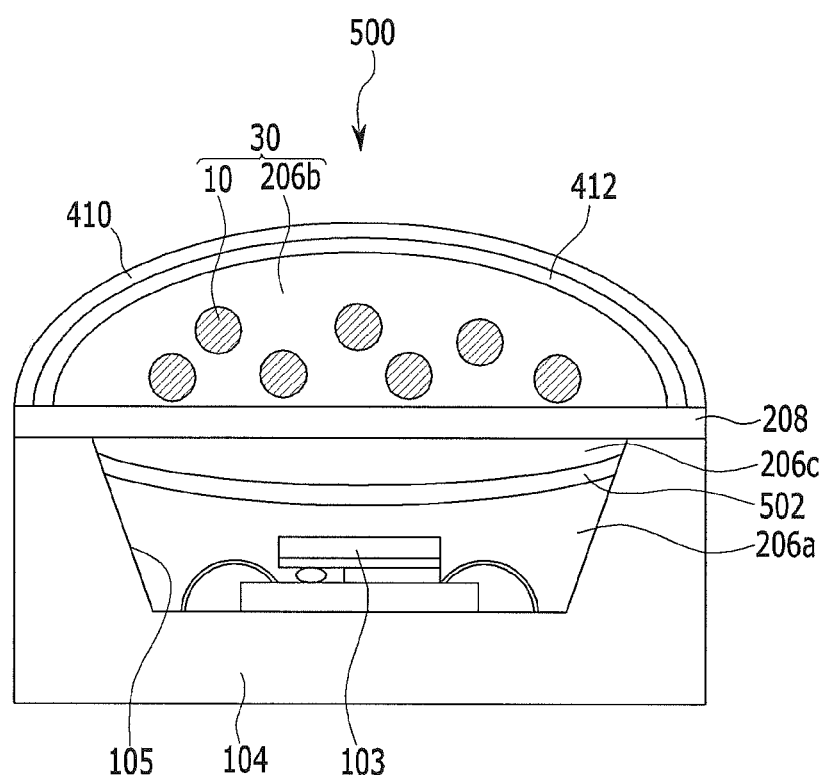

A light emitting diode 500 shown in FIG. 6 includes the light source 103; the first matrix 206a disposed on the light source 103; an organic/inorganic hybrid polymer layer 502 including an organic/inorganic hybrid polymer disposed on the first matrix 206a; a third matrix 206c disposed on the organic/inorganic hybrid polymer layer 502; the transparent plate 208 disposed on and covering the third matrix 206c; the light conversion layer 30 including the semiconductor nanocrystal-polymer composite 10 and the second matrix 206b present on the transparent plate 208; and the first polymer film 410 and the second polymer film 412 present on the semiconductor nanocrystal-polymer composite 10 and the second matrix 206b. The organic/inorganic hybrid polymer layer may have a surface which is substantially parallel to a surface of the light source.

The first matrix 206a, the second matrix 206b and the third matrix 206c may be each independently selected from a silicone resin; an epoxy resin; a (meth)acrylate-based resin; silica; a metal oxide; a copolymer of a first monomer including at least two thiol (—SH) groups at a terminal end and a second monomer including at least two carbon-carbon unsaturated bond-containing group at a terminal end; and a combination thereof, and in one embodiment a silicone resin may be desired.

The metal oxide may include alumina, titania, zirconia, and the like. The copolymer of a first monomer including at least two thiol (—SH) groups at a terminal end and a second monomer including at least two carbon-carbon unsaturated bond-containing group at a terminal end are the same as in descriptions of the first monomer and second monomer that constitute the matrix of the composite including the semiconductor nanocrystal-polymer composite 10 and a matrix.

The first matrix 206a, the second matrix 206b and the third matrix 206c may be the same or different from each other. In one embodiment, for the first matrix 206a, a silicone resin having excellent transparency and refractive index characteristics and a high thermal stability may be desirable.

The organic/inorganic hybrid polymer layer 502 includes an organic/inorganic hybrid polymer that may be the same or different than the second polymer film 412. The organic/inorganic hybrid polymer layer 502 may prevent the blackening of the reflector 105 (e.g., an Ag reflector) present in the surface of the substrate 104 by sulfur atoms when the semiconductor nanocrystal-polymer composite 10 contains sulfur atoms.

The organic/inorganic hybrid polymer layer 502 may be present between the light source 103 of light emitting diode 100, 200, 300, and 400 shown in FIG. 2 to FIG. 5 as well as the light emitting diode 500 shown in FIG. 6 and the semiconductor nanocrystal-polymer composite 10.

The semiconductor nanocrystal-polymer composite 10 absorbs the light emitting energy of the light source 103 and emits the excited energy as light having a different wavelength. The semiconductor nanocrystal-polymer composite 10 may control the light emitting wavelength in various ways. For example, when a red light emitting composite particle and a green light emitting composite particle are associated with a blue light emitting source, it may provide a white light emitting diode. Alternatively, when red, green, and blue light emitting composite particles are associated with the ultraviolet (UV) light emitting source, it may provide a white light emitting diode. In addition, when a light emitting composite emitting light in various wavelengths is associated with a light source, it may provide a light emitting diode emitting light in various wavelengths.

Hereinafter, an embodiment is further illustrated in more detail with reference to examples. However, the following are exemplary embodiments and shall not be limiting.

Preparation Example 1

Synthesis of Semiconductor Nanocrystal

About 16 grams (g) of trioctylamine (hereinafter referred to as "TOA"), about 0.3 g of octadecyl phosphonic acid, and 0.4 millimole (mmol) of cadmium oxide are simultaneously introduced into a 125 milliliter (mL) flask mounted with a reflux condenser and under vacuum while undergoing agitation, and heated to about 120° C. Then, after the temperature reaches about 120° C., nitrogen is flowed therein and the reaction temperature is controlled to about 300° C.

Separately, Se powder is dissolved in trioctylphosphine (TOP) to provide a 2 molar (M) Se-TOP complex solution. About 2 mL of the 2 M Se-TOP complex solution is quickly injected into the reaction mixture that is agitated at about 300° C. and reacted for about 2 minutes.

After completing the reaction, the temperature of the reaction mixture is cooled as quickly as possible to room temperature, ethanol (a non-solvent) is added, and the mixture centrifuged. The supernatant of the centrifuged solution (excluding the centrifuged precipitate) is discarded, and the precipitate is dispersed in toluene to synthesize a CdSe nanocrystal solution which emits light at 485 nanometers (nm).

About 8 g of TOA, about 0.1 g of oleic acid, and about 0.4 mmol of zinc acetate are simultaneously introduced into a 125 mL flask mounted with a reflux condenser, and the reaction temperature is controlled to about 300° C. while agitating the mixture. About 1 wt % of the synthesized CdSe nanocrystal solution is added into the mixture of reactants in an amount of 1 mL, and about 2 mL of a 0.4 M S-TOP complex solution is slowly added thereto and reacted for about one hour to develop a ZnS nanocrystal on the CdSe nanocrystal surface and to provide a CdSe//ZnS alloy nanocrystal through diffusion at the interface. The 0.4M S-TOP complex solution is prepared by dissolving sulfur powders in trioctylphosphine (TOP). Herein "//" is used to distinguish core and shell layers in a nanocrystal, for example the CdSe core and the ZnS shell of the CdSe//ZnS alloy nanocrystal.

After completing the reaction, the temperature of the reaction mixture is cooled to room temperature as quickly as possible, ethanol (a non-solvent) is added thereto, and the mixture centrifuged. The supernatant of the centrifuged solution (excluding the centrifuged precipitant) is discarded, and the precipitate is dispersed in toluene to synthesize a CdSe//ZnS alloy nanocrystal solution which emits light at 458 nm and has a size of about 5 nm.

About 8 g of TOA, about 0.1 g of oleic acid, about 0.05 mmol of cadmium oxide, and about 0.4 mmol of zinc acetate are simultaneously introduced into a 125 mL flask mounted with a reflux condenser, and the reaction temperature is controlled to about 300° C. while agitating the mixture. About 1 weight percent (wt %) of the synthesized CdSe//ZnS nanocrystal solution is added into the resultant in an amount of about 1 mL and about 2 mL of a 0.4 M S-TOP complex solution is slowly added thereto and reacted for about one hour to develop the CdSZnS nanocrystal shell on the CdSe//ZnS nanocrystal surface and to provide a CdSe//ZnS/CdSZnS core/shell/shell nanocrystal which emits light at about 535 nm. The "/" is used to distinguish shell layers in the nanocrystal, for example the ZnS shell and the CdSZnS shell in the CdSe//ZnS/CdSZnS core/shell/shell nanocrystal.

After completing the reaction, the reaction mixture is cooled to room temperature as quickly as possible, and ethanol (a non-solvent) is added thereto and centrifugation is performed. The supernatant of the solution (excluding the centrifuged precipitate) is discarded, and the precipitate is dispersed in toluene to synthesize the CdSe//ZnS/CdSZnS semiconductor nanocrystal solution. The green semiconductor nanocrystal has quantum efficiency of about 93%.

Example 1

Preparation of Semiconductor Nanocrystal-Polymer Composite 1 g of poly(ethylene-co-acrylic acid) polymer (containing 5 wt % of polyacrylic acid units) and having a weight average molecular weight of 2000 Da is introduced in a flask with 4 mL of toluene and the mixture heated at 100° C. to provide a polymer dispersion. A CdSe//ZnS/CdSZnS green semiconductor nanocrystal is dispersed in 40 mL of toluene until the absorption of the first absorption maximum wavelength has an optical density (OD) of 0.069 in a UV-Vis absorption spectrum to provide a semiconductor nanocrystal dispersion. 4 mL of the semiconductor nanocrystal dispersion is added into the polymer dispersion in a dropwise fashion and further reacted for 30 minutes. Then 5 mL of a solution, in which diethyl zinc ($Zn(Et)_2$) is dissolved in toluene at a concentration of 0.2 M, is added in a dropwise fashion and the resulting mixture further heated for 30 minutes. The diethyl zinc solution is added such that Zn cations from $Zn(Et)_2$ are added at in an amount of 0.5 mole based on 1 mole of the carboxylate anion groups of the polymer. In this case, an aggregate is observed. The solution is cooled to about 50° C. after the reaction, and only the aggregate is filtered, washed with hexane, and dried.

DSC and TGA Analysis

Figure 7:
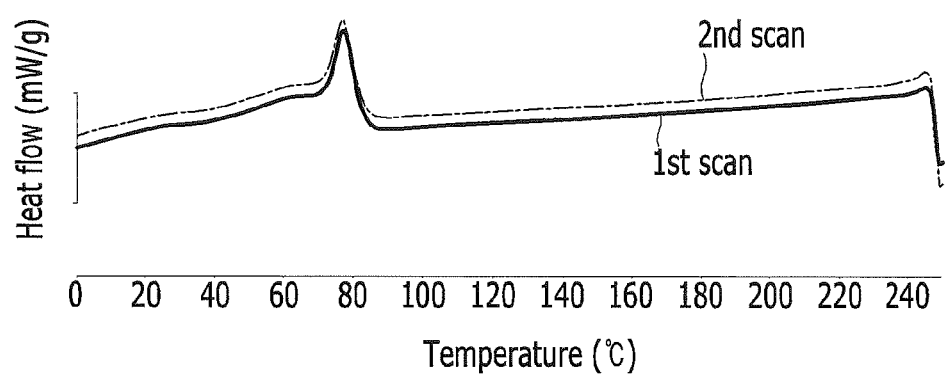
FIGS. 7 and 8 are each a graph of heat flow (milliwatts per gram, mW/g) versus temperature (° C.) which show the results of differential scanning calorimetry (DSC) analysis of poly(ethylene-co-acrylic acid) before and after adding a zinc salt according to Example 1, respectively.
Figure 8:
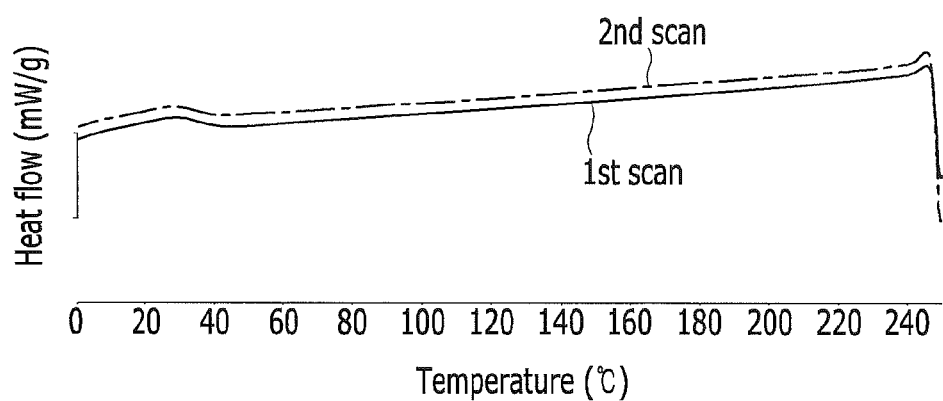

The poly(ethylene-co-acrylic acid) used in Example 1 is heated to 240° C. at a speed of 10° C./min under an $N_2$ atmosphere to carry out differential scanning calorimetry (DSC) analysis before and after adding diethyl zinc. The DSC analysis is performed using DSC 2010 (TA Instruments) equipment. The results are shown in FIG. 7 and FIG. 8, respectively. As shown in FIG. 7 and FIG. 8, a peak is observed before adding diethyl zinc, but a peak is not observed after adding diethyl zinc. From these results, it is confirmed that the melting point (Tm) of the poly(ethylene-co-acrylic acid) is increased by adding diethyl zinc.

Figure 9:
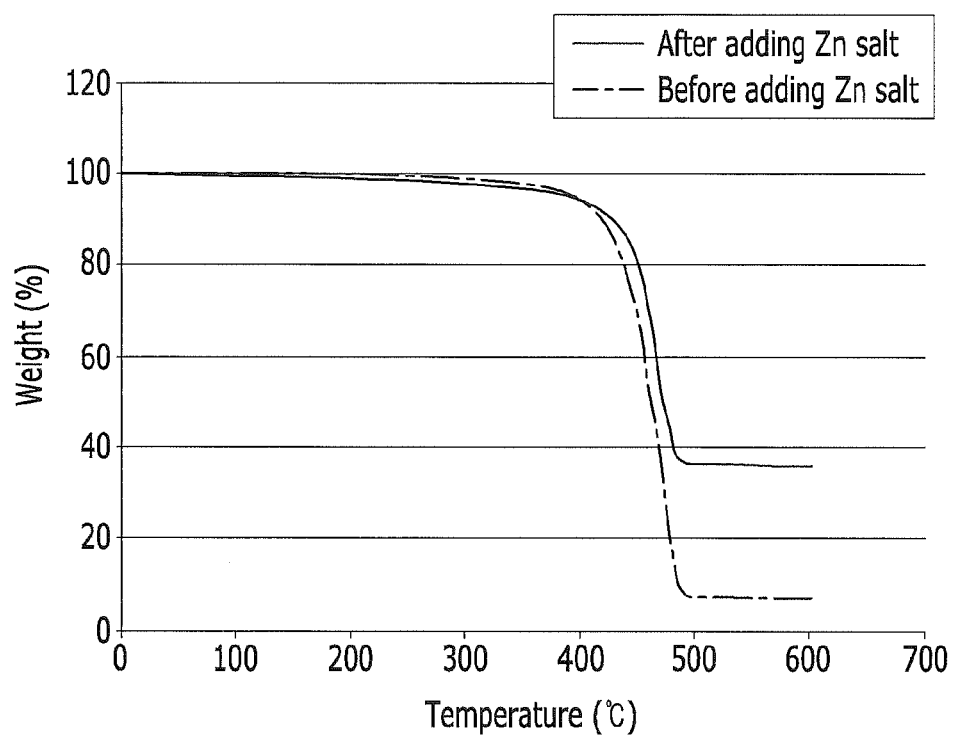
FIG. 9 is a graph of weight (percent, %) versus temperature (° C.) which shows the results of thermogravimetric analysis (TGA) analysis of poly(ethylene-co-acrylic acid) before and after adding a zinc salt.

FIG. 9 shows the results of thermogravimetric analysis (TGA) of the poly(ethylene-co-acrylic acid) before and after adding diethyl zinc by heating from room temperature to 600° C. under the $N_2$ atmosphere at a rate of 10° C. per minute. The thermogravimetric analysis is performed on a Q5000IR (TA Instruments) instrument. As shown in FIG. 9, the thermal decomposition temperature is increased after adding diethyl zinc, confirming that the thermal stability is improved.

Example 2

Preparation of Semiconductor Nanocrystal-Polymer Composite 1 g of poly(ethylene-co-acrylic acid) polymer (containing polyacrylic acid units in an amount of 5 wt % of the polymer) having a weight average molecular weight of 2000 Da is introduced into a flask with 4 mL of trioctylamine (TOA) and heated at 120° C. to provide a polymer dispersion. A CdSe//ZnS/CdSZnS green semiconductor nanocrystal is dispersed in 40 mL of trioctylamine until the absorption of the first absorption maximum wavelength has an optical density (OD) of 0.069 in a UV-Vis absorption spectrum to provide a semiconductor nanocrystal dispersion. 4 mL of the semiconductor nanocrystal dispersion is added into the polymer dispersion in a dropwise fashion and further reacted for 30 minutes. Then 5 mL of a solution in which diethyl zinc ($Zn(Et)_2$) is dissolved in toluene at a concentration of 0.2 M is added in a dropwise fashion and the resulting mixture further heated for 30 minutes. The diethyl zinc solution is added such that Zn cations from $Zn(Et)_2$ are added in an amount of 0.5 mol based on 1 mol of the carboxylate anion groups of the polymer. In this case, an aggregate is observed. The solution is cooled to about 50° C. after the reaction, and only the aggregate is filtered, washed with hexane, and dried.

Example 3

Preparation of Semiconductor Nanocrystal-Polymer Composite 1 g of a poly(ethylene-co-acrylic acid) polymer (containing polyacrylic acid units in an amount of 5 wt % of the polymer) having a weight average molecular weight of 2000 Da is introduced into a flask and added with 4 mL of trioctylamine (TOA) and heated at 120° C. to provide a polymer dispersion. A CdSe//ZnS/CdSZnS green semiconductor nanocrystal is dispersed in 40 mL of trioctylamine until the absorption of the first absorption maximum wavelength has an optical density (OD) of 0.069 in a UV-Vis absorption spectrum to provide a semiconductor nanocrystal dispersion. 4 mL of the semiconductor nanocrystal dispersion is added into the polymer dispersion in a dropwise fashion and further reacted for 30 minutes. 1.0 mmol of zinc acetate, 2.0 mmol of oleic acid, and 5 mL of TOA are heated at 300° C. to prepare a 0.2 M zinc oleate solution, and 5 mL of the 0.2 M zinc oleate solution is added in a dropwise fashion followed by further heating for 30 minutes. Zn cations from the zinc oleate are added in an amount of 0.5 mol based on 1 mol of the carboxylate anion groups of the polymer. In this case, an aggregate is observed. The solution is cooled to about 50° C. after the reaction, and only the aggregate is filtered, washed with hexane, and dried.

Comparative Example 1

Preparation of Semiconductor Nanocrystal-Polymer Composite 1 g of a poly(ethylene-co-acrylic acid) polymer (containing polyacrylic acid units in an amount of 5 wt % of the polymer) having a weight average molecular weight of 2000 Da is introduced into a flask with 4 mL of trioctyl amine (TOA) and heated at 120° C. to provide a polymer dispersion. A CdSe//ZnS/CdSZnS green semiconductor nanocrystal is dispersed in 40 mL of trioctyl amine until the absorption of the first absorption maximum wavelength reaches an optical density of 0.069 in a UV-Vis absorption spectrum to provide a semiconductor nanocrystal dispersion. 4 mL of the semiconductor nanocrystal dispersion is added into the polymer dispersion in a dropwise fashion and further reacted for 30 minutes. The solution is cooled to room temperature after the reaction, and only the resulting aggregate is filtered, washed with hexane, and dried.

Example 4

Fabrication of Light Emitting Diode (LED) Device

The silicone resins OE6630A and OE6630B (available from and manufactured by Dow Corning) are preliminarily mixed in a weight ratio of 1:4, and vapor is removed. Using a portion of the mixture of the silicone resins OE6630A and OE6630B, 0.1 g of the semiconductor nanocrystal-polymer composite obtained from Example 1 and 0.5 g of the mixture of the silicone resins OE6630A and OE6630B are mixed, uniformly agitated, and the foam removed under a vacuum. About 10 microliters (µL) of the mixture of the silicone resins including no semiconductor nanocrystal (QD) is coated on a surface mount device (SMD)-formed blue LED and attached to a glass plate having a thickness of 0.2 millimeters (mm) and an area corresponding to the size of an LED mold. Then, about 5 µL of the silicon resin including the semiconductor nanocrystal is coated on the glass plate and cured at 150° C. for 2 hours to provide a light emitting diode.

Example 5

Fabrication of Light Emitting Diode (LED) Device

The silicone resins OE6630A and OE6630B (available and manufactured by Dow Corning) are preliminarily mixed in a weight ratio of 1:4, and vapor is removed. Using a portion of the mixture of the silicone resins OE6630A and OE6630B, 0.1 g of the semiconductor nanocrystal-polymer composite obtained from Example 1 and 0.5 g of the mixture of the silicone resins are mixed, uniformly agitated, and the foam removed under a vacuum. About 10 microliters (µL) of the mixture of the silicone resins including no semiconductor nanocrystal (QD) is coated on an SMD-formed blue LED and attached to a glass plate having a thickness of 0.2 mm and an area corresponding to the size of the LED mold. Then about 5 µL of the mixture of silicon resins including the semiconductor nanocrystal is coated on the glass plate and cured at 150° C. for 2 hours. A first monomer of pentaerythritol tetrakis (3-mercapto propionate) and a second monomer of 1,3,5-triallyl-1,3,5-triazine-2,4,6 (1H,3H,5H)-trione are mixed in a mole ratio of 3:4 and coated with a solution of a polymerization initiator prepared by adding Igacure 754 in an amount of 1 part by weight, based on a total of 100 parts by weight of the first monomer and the second monomer. The coated solution is exposed to UV light for 10 minutes to provide a light emitting diode formed with a polymer film (barrier film).

Comparative Example 2

Fabrication of Light Emitting Diode (LED) Device

A light emitting diode is fabricated in accordance with the same procedure as in Example 5, except that the semiconductor nanocrystal-polymer composite obtained from Comparative Example 1 is used instead of the semiconductor nanocrystal-polymer composite obtained from Example 1.

Figure 10:
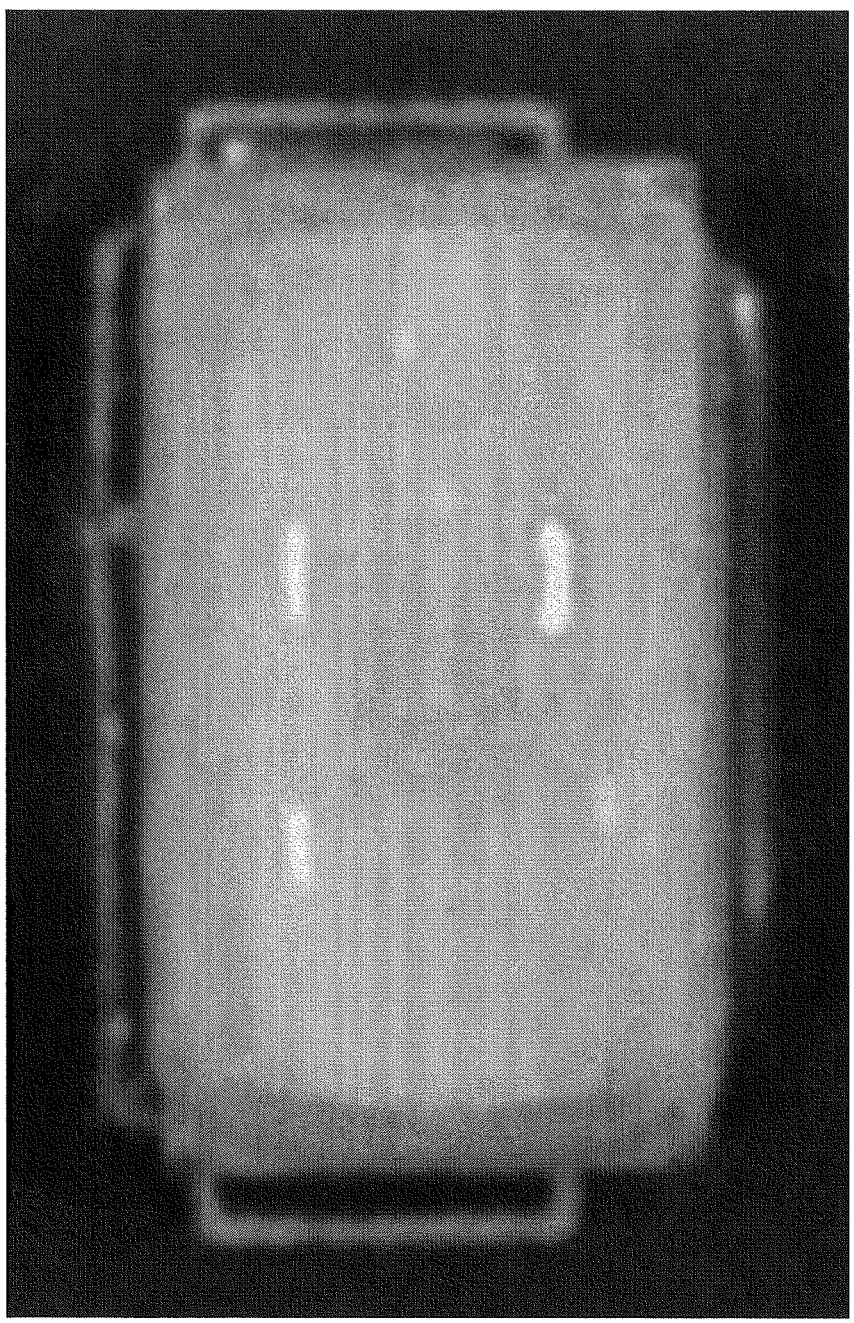
FIGS. 10 and 11 are photographs showing the surface of light emitting diode devices (optoelectronic devices) obtained in Example 5 and Comparative Example 2, respectively.
Figure 11:
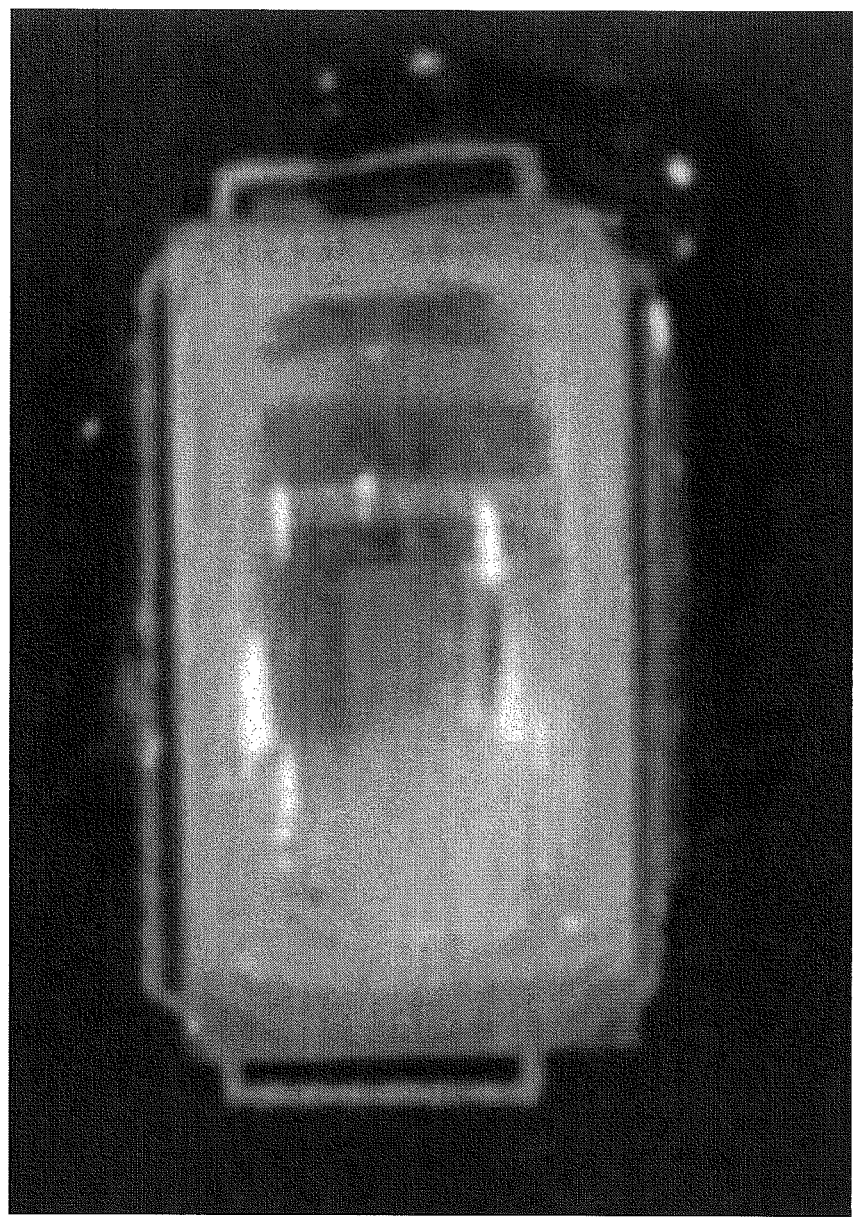

FIG. 10 and FIG. 11 are surface photographs of the light emitting diode devices obtained from Example 5 and Comparative Example 2, respectively. As shown in FIG. 10, the light from the light emitting diode of Example 5 is uniform. While not wanting to be bound by theory, it is understood that the diethyl zinc is entirely and uniformly dispersed in the light emitting diode device obtained from Example 5, and that the melting point is increased and the dispersion is improved by further adding a metal cation, such as zinc from the diethyl zinc. Also, light from the light emitting diode of Comparative Example 2 is not uniform, as shown in FIG. 11. While not wanting to be bound by theory, it is understood that in the device of Comparative Example 2, the semiconductor nanocrystal is aggregated in some parts of the light emitting diode device.

Figure 12:
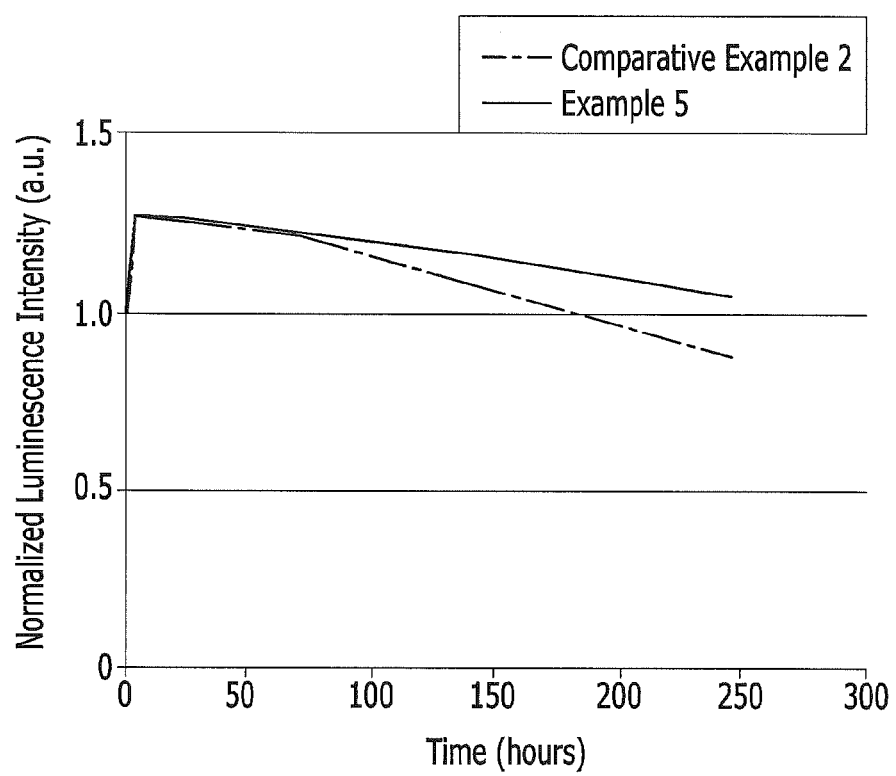
FIGS. 12 and 13 are each a graph of normalized luminescence intensity (arbitrary units, a.u.) versus time (hours) which show the luminescence characteristics of light emitting diode devices obtained in Example 5 and Comparative Example 2, respectively, when measured at 85° C. and 85% relative humidity.
Figure 13:
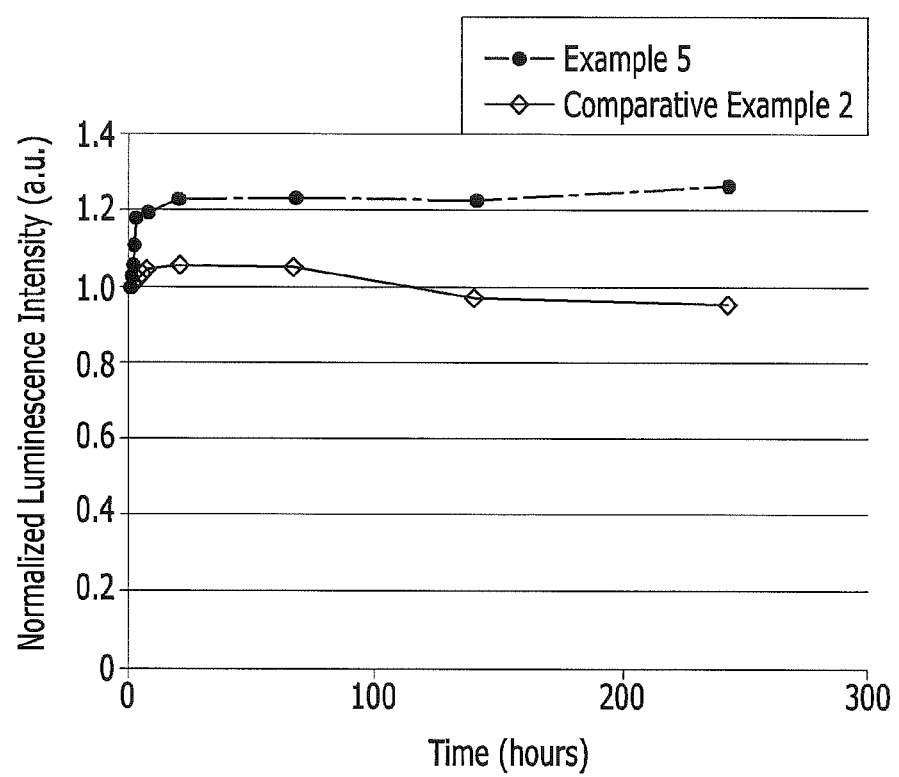
Figure 14:
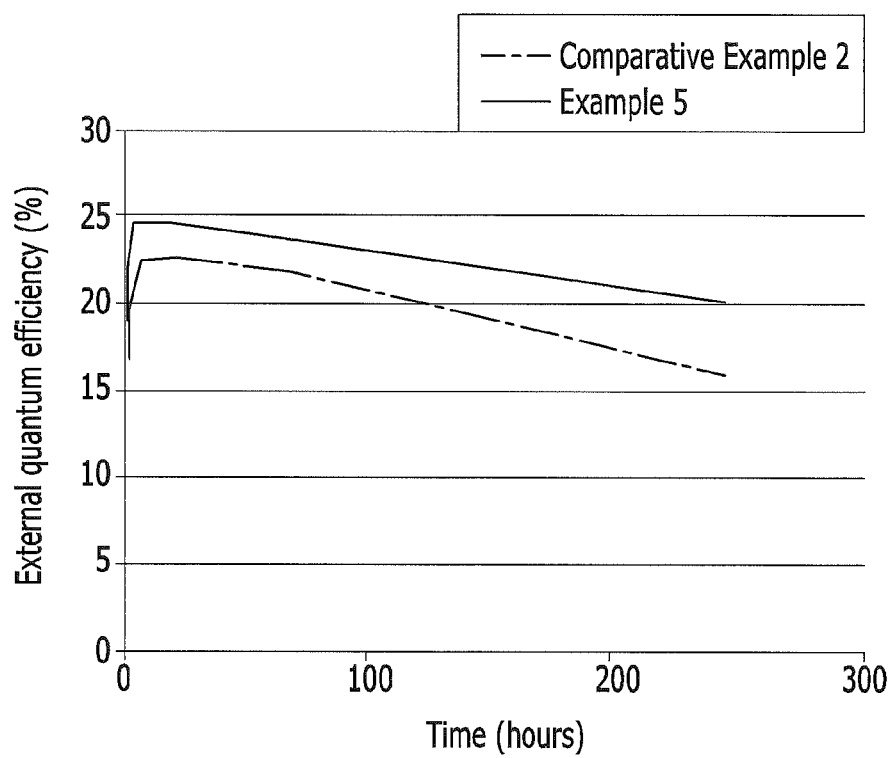
FIG. 14 is a graph of external quantum efficiency (percent, %) versus time (hours) which shows the external quantum efficiency (EQE) of light emitting diode devices obtained in Example 5 and Comparative Example 2 when measured at 85° C. and 85% relative humidity.

FIG. 12 shows the green light emitting luminescence characteristics of the light emitting diode devices obtained from Example 5 and Comparative Example 2, respectively, at 85° C. and 85% relative humidity. FIG. 13 shows the blue light emitting luminescence characteristics of the light emitting diode devices obtained from Example 5 and Comparative Example 2, respectively, at 85° C. and 85% relative humidity. FIG. 14 shows the external quantum efficiency (EQE) of the light emitting diode devices obtained from Example 5 and Comparative Example 2, respectively, at 85° C. and a relative humidity of 85%. As shown in FIG. 12 to FIG. 14, it is confirmed that the light emitting diode device obtained from Example 5 has luminance and efficiency characteristics which are better than those of the device of Comparative Example 1. As shown in FIG. 14, at all times the device of Example 5 provided greater EQE than the device of Comparative Example 2, and the rate of degradation of the EQE of the device of Example 5 was less than that of the device of Comparative Example 2.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor nanocrystal-polymer composite comprising:
   a semiconductor nano crystal;
   a polymer comprising a plurality of carboxylate anion groups (—COO⁻) bindable to a surface of the semiconductor nanocrystal; and
   a metal cation bindable to a carboxylate anion group of the plurality of carboxylate anion groups,
   wherein the polymer comprises a first carboxylate anion group bonded to the surface of the semiconductor nanocrystal and a second carboxylate anion group bonded to the metal cation.

2. The semiconductor nanocrystal-polymer composite of claim 1, wherein the semiconductor nanocrystal is selected from a Group II-VI compound, a Group III-V compound, a Group IV-VI compound, a Group IV element, a Group IV compound, and a combination thereof.

3. The semiconductor nanocrystal-polymer composite of claim 1, wherein the semiconductor nanocrystal comprises a core and a shell, and wherein the core and the shell are each independently a Group II-VI compound.

4. The semiconductor nanocrystal-polymer composite of claim 1, wherein the polymer comprising the carboxylate anion groups comprises a carboxylate anion group-containing structural unit in an amount of about 1 to about 100 mol%, based on a total moles of structural units of the polymer.

5. The semiconductor nanocrystal-polymer composite of claim 1, wherein the polymer comprising the carboxylate anion groups is present in an amount of about 50 to about 10,000 parts by weight, based on 100 parts by weight of the semiconductor nano crystal.

6. The semiconductor nanocrystal-polymer composite of claim 1, wherein the polymer comprising the carboxylate anion groups has a melting point (Tm) of about 50° C. to about 400° C.

7. The semiconductor nanocrystal-polymer composite of claim 1, wherein the polymer comprising the carboxylate anion groups comprises an alkylene structural unit and a structural unit represented by the following Chemical Formula 1:

Chemical Formula 1

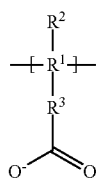

wherein, in Chemical Formula 1,
$R^1$ is a substituted or unsubstituted C2 to C20 linear or branched alkylene group,
$R^2$ is hydrogen or a methyl group, and
$R^3$ is a single bond; a substituted or unsubstituted C1 to C50 alkylene group; a substituted or unsubstituted C2 to C50 alkenylene group; a C2 to C50 alkylene group wherein at least one methylene group (—CH₂—) is replaced with a sulfonyl group (—SO₂—), a carbonyl group (—C(O)—), an ether group (—O—), a sulfide group (—S—), a sulfoxide group (—S(O)—), an ester group (—C(=O)O—), an amide group (—C(=O)NR—, wherein R is hydrogen or a C1 to C10 alkyl group), an amino group (—NR—, wherein R is hydrogen or a C1 to C10 alkyl group), or a combination thereof; or a C3 to C50 alkenylene group wherein at least one methylene group (—CH₂—) is replaced with a sulfonyl group (—SO₂—), a carbonyl group (—C(O)—), an ether group (—O—), a sulfide group (—S—), a sulfoxide group (—SO—), an ester group (—C(=O)O—), an amide group (—C(=O)NR—, wherein R is hydrogen or a C1 to C10 alkyl group), an amino group (—NR—, wherein R is hydrogen or a C1 to C10 alkyl group), or a combination thereof.

8. The semiconductor nanocrystal-polymer composite of claim 7, wherein the polymer comprising the carboxylate anion groups is a poly(alkylene-co-(meth)acrylic acid) copolymer.

9. The semiconductor nanocrystal-polymer composite of claim 8, wherein a (meth)acrylic acid structural unit of the copolymer is present in an amount of about 2 to about 20 mole percent, based on a total moles of structural units in the copolymer.

10. The semiconductor nanocrystal-polymer composite of claim 8, wherein the copolymer is poly(ethylene-co-acrylic acid).

11. The semiconductor nanocrystal-polymer composite of claim 1, wherein the metal cation is present in an amount of about 0.1 to about 1.5 moles, per mole of the carboxylate anion groups of the polymer.

12. The semiconductor nanocrystal-polymer composite of claim 1, wherein the metal cation is selected from an alkaline-earth metal, a rare earth element, a transition element, a Group 12 element, a Group 13 element, and a combination thereof.

13. The semiconductor nanocrystal-polymer composite of claim 12, wherein the metal cation is a cation of a metal selected from Mg, Ca, Sc, Ti, V, Cr, Mn, Fe, Co, Ni, Cu, Zn, Ga, Sr, Y, Zr, Nb, Mo, Cd, In, Ba, Au, Hg, Tl, and a combination thereof.

14. The semiconductor nanocrystal-polymer composite of claim 13, wherein the metal is zinc.

15. The semiconductor nanocrystal-polymer composite of claim 1, wherein the semiconductor nanocrystal-polymer composite is in the form of a particle.

16. A composite film comprising the semiconductor nanocrystal-polymer composite according to claim 1 and a matrix in which the semiconductor nanocrystal-polymer composite is dispersed.

17. An optoelectronic device comprising the semiconductor nanocrystal-polymer composite according to claim 1.

18. The optoelectronic device of claim 17, wherein the optoelectronic device comprises a light source, and a light conversion layer comprising the semiconductor nanocrystal-polymer composite disposed on the light source.

19. The optoelectronic device of claim 18, further comprising a polymer layer comprising an organic/inorganic hybrid polymer between the light source and the semiconductor nanocrystal-polymer composite.

20. The optoelectronic device of claim 17, wherein the optoelectronic device comprises:
   a light source;
   a first matrix disposed on the light source;
   a transparent plate disposed on and covering the first matrix; and
   the semiconductor nanocrystal-polymer composite and a second matrix, each disposed on the transparent plate.

21. The optoelectronic device of claim 20, further comprising an organic/inorganic hybrid polymer layer comprising an organic/inorganic hybrid polymer, wherein the organic/inorganic hybrid polymer layer has a surface which is substantially parallel to a surface of the light source and wherein the organic/inorganic hybrid polymer layer is between the light source and the transparent plate.

22. A composition for manufacture of a semiconductor nanocrystal-polymer composite, the composition comprising:
   a semiconductor nano crystal;
   a polymer comprising a plurality of carboxyl groups (—COOH); and
   a metal compound comprising a metal cation bindable to a carboxyl group of the plurality of carboxyl groups,
wherein the semiconductor nanocrystal-polymer composite comprises
   a semiconductor nano crystal,
   a polymer comprising a plurality of carboxylate anion groups (—COO$^-$) bindable to a surface of the semiconductor nanocrystal, and
   a metal cation bindable to a carboxylate group of the plurality of carboxylate anion groups,
   wherein the polymer comprises a first carboxylate anion group bonded to the surface of the semiconductor nanocrystal and a second carboxylate anion group bonded to the metal cation.

23. The composition of claim 22, wherein a carboxyl group of the plurality of carboxyl groups is bindable to a surface of the semiconductor nanocrystal.

24. The composition of claim 22, wherein the semiconductor nanocrystal is selected from a Group II-VI compound, a Group III-V compound, a Group IV-VI compound, a Group IV element, a Group IV compound, and a combination thereof.

25. The composition of claim 22, wherein the polymer comprising the carboxyl groups comprises a carboxyl group-containing structural unit in an amount of about 1 to about 100 mole percent, based on a total moles of structural units of the polymer.

26. The composition of claim 22, wherein the polymer comprising the carboxyl groups is present in an amount of about 50 to about 10,000 parts by weight, based on 100 parts by weight of the semiconductor nanocrystal.

27. The composition of claim 22, wherein the polymer comprising the carboxyl groups has a melting point (Tm) of about 50° C. to about 300° C.

28. The composition of claim 22, wherein the polymer comprising the carboxyl groups is a poly(alkylene-(meth) acrylic acid) copolymer of an alkylene and acrylic acid, methacrylic acid, or a combination thereof.

29. The composition of claim 22, wherein the metal compound is an organometallic compound, an organic salt, or an inorganic salt including a metal selected from an alkaline-earth metal, a rare earth element, a transition element, a Group 12 element, a Group 13 element, and a combination thereof.

30. The composition of claim 22, wherein the metal compound is an organic salt, an inorganic salt, or an organometallic compound comprising a metal selected from Mg, Ca, Sc, Ti, V, Cr, Mn, Fe, Co, Ni, Cu, Zn, Ga, Sr, Y, Zr, Nb, Mo, Cd, In, Ba, Au, Hg, Tl, and a combination thereof.

31. The composition of claim 30, wherein the metal compound comprises zinc.

32. The composition of claim 30, wherein the metal compound is selected from dimethyl zinc, diethyl zinc, zinc acetate, zinc stearate, zinc oleate, zinc acetylacetonate, zinc chloride, and a combination thereof.

33. A method of preparing a semiconductor nanocrystal-polymer composite, the method comprising:
   dispersing a polymer comprising a plurality of carboxyl groups (—COOH) in an organic solvent to provide a polymer dispersion,
   contacting the polymer dispersion with a semiconductor nanocrystal and a metal compound comprising the metal cation bindable with a carboxyl group of the plurality of carboxyl groups of the polymer to provide a mixture; and
   drying the mixture to prepare the semiconductor nanocrystal-polymer composite.

34. The method of claim 33, further comprising cooling after the adding a metal compound.

35. A semiconductor nanocrystal-polymer composite comprising:
   a semiconductor nano crystal;
   a first polymer comprising a plurality of carboxylate anion groups (—COO$^-$) bindable to a surface of the semiconductor nanocrystal; and
   an ionic second polymer comprising a plurality of carboxylate anion groups (—COO$^-$) bindable to the surface of the semiconductor nanocrystal and a metal cation bindable to a carboxylate anion group of the plurality of carboxylate anion groups,
   wherein a content of the ionic polymer is 1 to about 90 weight percent, based on a total weight of the first polymer and the second polymer.

* * * * *